(12) United States Patent
Okamura et al.

(10) Patent No.: US 6,336,423 B1
(45) Date of Patent: *Jan. 8, 2002

(54) APPARATUS FOR FORMING A DEPOSITED FILM BY PLASMA CHEMICAL VAPOR DEPOSITION

(75) Inventors: Ryuji Okamura, Souraku-gun; Toshiyasu Shirasuna, Nara; Kazuhiko Takada, Nara; Kazuyoshi Akiyama, Nara; Hitoshi Murayama, Soura-gun, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/112,643

(22) Filed: Jul. 9, 1998

(30) Foreign Application Priority Data

Jul. 9, 1997 (JP) .............................................. 9-199352

(51) Int. Cl.[7] .............................................. C23C 16/50
(52) U.S. Cl. ................................ 118/723 E; 118/723 R
(58) Field of Search ................................ 118/723 MW, 118/723 E, 723 I, 723 R

(56) References Cited

U.S. PATENT DOCUMENTS

| | | | | |
|---|---|---|---|---|
| 4,825,806 A | * | 5/1989 | Tawada et al. | 118/723 E |
| 5,090,356 A | * | 2/1992 | Nath et al. | 118/723 E |
| 5,129,359 A | | 7/1992 | Takei et al. | |
| 5,455,138 A | | 10/1995 | Okamura et al. | |
| 5,534,070 A | * | 7/1996 | Okamura et al. | 118/723 E |
| 5,578,130 A | * | 11/1996 | Hayashi et al. | 118/723 E |
| 5,648,701 A | * | 7/1997 | Hooke et al. | 315/111.21 |
| 5,653,812 A | * | 8/1997 | Petrmichl et al. | 118/723 E |
| 5,891,350 A | * | 4/1999 | Shan et al. | 118/723 E |
| 5,897,740 A | * | 4/1999 | Tamura | 118/723 R |

FOREIGN PATENT DOCUMENTS

| | | |
|---|---|---|
| JP | 60-168156 | 8/1985 |
| JP | 60-178457 | 9/1985 |
| JP | 60-186849 | 9/1985 |
| JP | 60-225854 | 11/1985 |
| JP | 61-231561 | 10/1986 |

* cited by examiner

Primary Examiner—Bret Chen
(74) Attorney, Agent, or Firm—Fitzpatrick, Cella, Harper & Scinto

(57) ABSTRACT

A film-forming apparatus is provided which comprises a reaction chamber capable of being vacuumed and having a reaction space in which a plurality of substrates can be arranged on a common circumference to establish an inner space circumscribed by the plurality of substrates. A film-forming raw material gas can be introduced into the inner space. A first electrode for supplying a high frequency power into the inner space is provided at a central position in the inner space circumscribed by the plurality of substrates. A second electrode is provided outside the plurality of substrates arranged on the common circumference. A shielding member having a dielectric portion constituted by a dielectric material is provided between the second electrode and the plurality of substrates arranged on the common circumference. The shielding member substantially shields the film-forming raw material gas so that it is confined inside the shielding member and transmits a high frequency power supplied to the second electrode into the inner space.

15 Claims, 6 Drawing Sheets

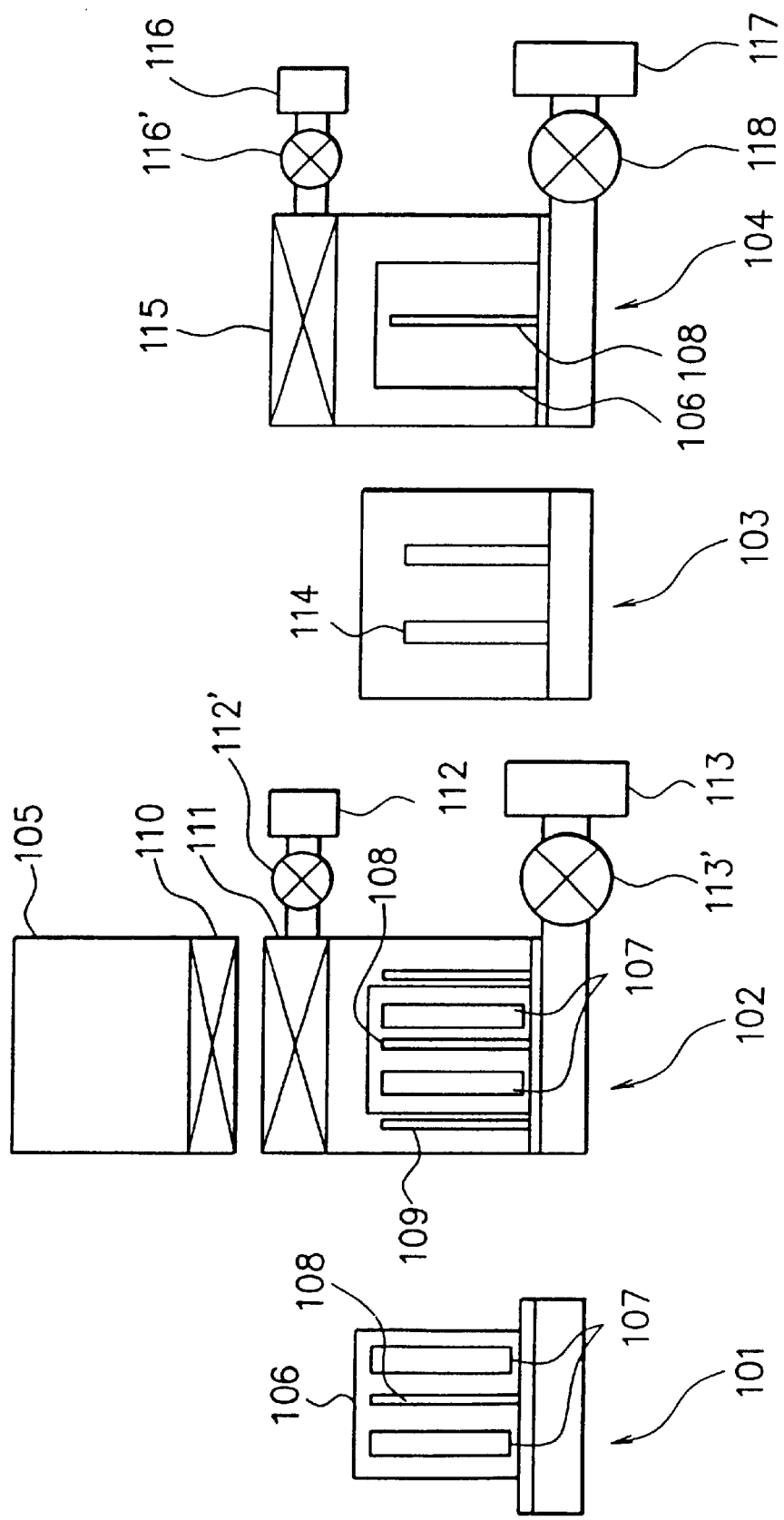

FIG. 4
(RESULTS OF EXAMPLE 4)
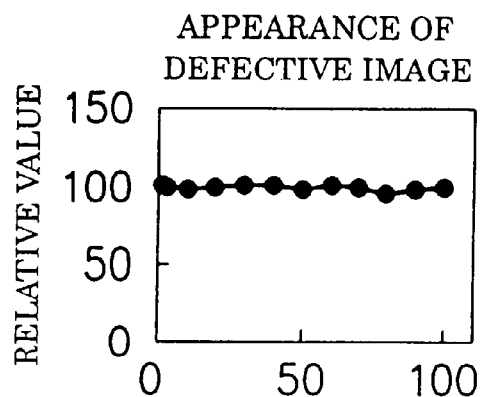
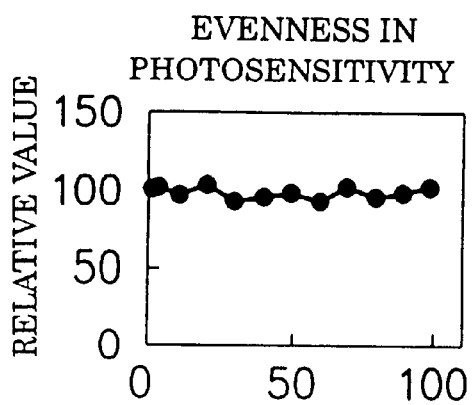
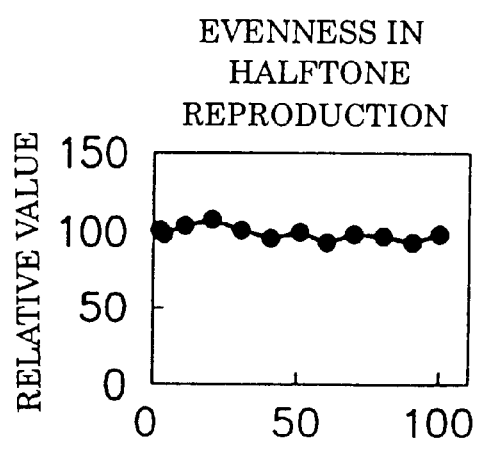
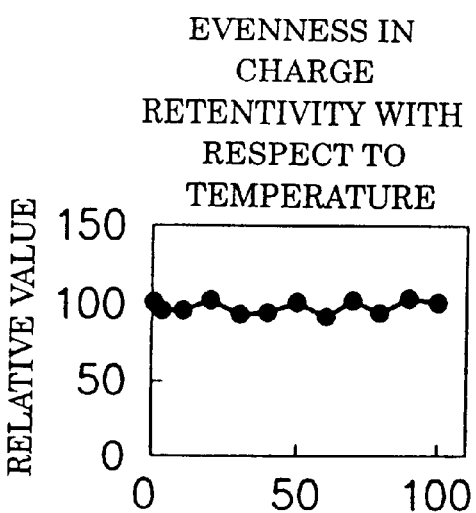
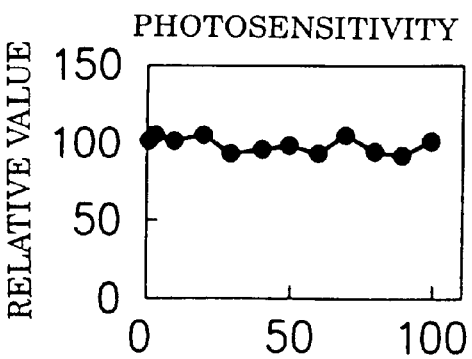

(RESULTS OF COMPARATIVE EXAMPLE 2)

APPARATUS FOR FORMING A DEPOSITED FILM BY PLASMA CHEMICAL VAPOR DEPOSITION

BACKGROUND OF THE INVENTION

1. Field of the Invention

The present invention relates to a method and an apparatus for forming a deposited film on a substrate by plasma chemical vapor deposition (hereinafter referred to simply as "plasma CVD") More particularly, the present invention relates to a method and an apparatus for forming a functional deposited film on a substrate by plasma CVD, the deposited film being usable as a semiconductor layer for use in semiconductor devices such as semiconductor circuit elements, electrophotographic photosensitive devices (or electrophotographic light receiving members), image input line sensors, image pickup devices, photovoltaic devices (including solar cells), and the like.

2. Related Background Art

Heretofore, as the constituent element members of semiconductor devices such as semiconductor circuit elements, electrophotographic photosensitive devices (or electrophotographic light receiving members), image input line sensors, image pickup devices, or other electronic devices including optical devices, there have been proposed a number of non-single crystalline semiconductor deposited films, for instance, amorphous semiconductor deposited films composed an amorphous material such as an amorphous silicon material compensated with hydrogen atoms (H) or/and halogen atoms (X). Some of these films have been put in practical use For some of these semiconductor devices in which such semiconductor deposited films are used as the constituents, there are several points which are required to be further improved, particularly in view of their productivity and production cost.

For instance, in the case of producing an electrophotographic light receiving member, it is required to form a large area deposited film having a relatively larger thickness in comparison with that of a deposited film formed in the production of other semiconductor devices. In order to form such deposited film having a large thickness, it takes a relatively long period of time. This situation often results in an increase in the production cost of an electrophotographic light receiving member obtained.

In consequence, there is a demand for providing an improved film-forming method or apparatus which enables to efficiently form a desirable deposited film having a desired thickness so that the productivity of an electrophotographic light receiving member can be improved while improving the efficiencies of various factors related to the production of the electrophotographic light receiving member.

In order to meet such demand, Japanese Unexamined Patent Publication No. 186849/1985 proposes a method for forming a deposited film using a plasma CVD appratus using microwave (hereinafter referred to as microwave plasma CVD apparatus) Particularly, this Japanese document describes a deposited film-forming method using a microwave plasma CVD apparatus, wherein a plurality of electrically conductive cylindrical substrates are arranged in a deposition chamber so as to establish an internal chamber in said deposition chamber, and a film-forming raw material gas is introduced into said internal chamber while introducing a microwave power thereinto, whereby the utilization efficiency of the film-forming raw material gas is improved and the productivity of a deposited film formed is improved.

Besides, U.S. Pat. No. 5,129,359 proposes a method for forming a high quality deposited film by applying an electric field of direct current in a discharge space for producing a plasma to control the potential of the plasma produced.

However, even in the case of such microwave plasma CVD apparatus as above described, there are still several points to be improved. That is, because a microwave power is introduced into the internal chamber from the opposite sides of the internal chamber (from the opposite sides of the arrangement of the electrically conductive cylindrical substrates in other words), a deposited film formed on each of the electrically conductive cylindrical substrates tends to have a variation in the characteristics in a generatrix direction, and the deposited films formed on the plurality of electrically conductive cylindrical substrates are sometimes ununiform in terms of the characteristics.

Such ununiformness in terms of the characteristics exerts an influence to the yield of a semiconductor device produced, and this situation eventually becomes a factor to raise the production cost of a semiconductor device produced even when the production capacity should be improved.

In order to improve this disadvantageous situation, U.S Pat. No. 5,455,138 proposes a deposited film-forming method using a plasma CVD apparatus in which a high frequency power with an oscillation frequency of 20 to 450 MHz is used. In this film-forming method, as well as in the case of the deposited film-forming method described in the foregoing Japanese document, a plurality of electrically conductive cylindrical substrates are arranged in a deposition chamber so as to establish an internal chamber in said deposition chamber, and a film-forming raw material gas is introduced into said internal chamber while introducing a high frequency power with such oscillation frequency (including an oscillation frequency belonging to so-called VHF (very high frequency) band region) thereinto, whereby the utilization efficiency of the film-forming raw material gas is improved and the productivity of a deposited film formed is improved.

However, electrophotographic apparatus (electrophotographic copying machines) in which an electrophotographic light receiving member is used have been rapidly progressed to have a high driving speed, an improved image-reproducing performance capable of providing a high quality image at a high speed, and a prolonged durability. In addition, digital copying machines and color copying machines in which an electrophotographic light receiving member is used have been developed and they have been widely using. In this connection, for an electrophotographic light receiving member to be used in these copying machines, there is an increased demand for further improving such that it is well compatible with such copying machines and it can stably and continuously provide an output having a further improvement not only in terms of the image quality but also in terms of the product quality.

Besides, in recent years, users of copying machines often have cared about the spaces occupied by the copying machines in order to make effective use of the limited space of an office for office works.

In consequence, it is necessary for the copying machine to be miniaturized, and along with this, it is indispensable for the electrophotographic light receiving member used therein to be also miniaturized It is necessary for such small electrophotographic light receiving member to be have a indeed improved performance and to be capable of being provided at a reasonable production cost.

SUMMARY OF THE INVENTION

The present invention is aimed at solving the foregoing problems in the prior art and providing an improved film-forming method and apparatus which enable to efficiently form a high quality deposited film having excellent characteristics, which satisfy the foregoing demands.

Another object of the present invention is to provide an improved film-forming method and apparatus which enable to stably afford a high quality deposited film having excellent characteristics, which can be desirably used in the production of a semiconductor device such as a semiconductor circuit element, electrophotographic light receiving member, image input line sensor, image pickup device, photovoltaic device, or the like, at a reasonable production cost.

A further object of the present invention is to provide a film-forming apparatus comprising a reaction chamber capable of being vacuumed and having a reaction space in which a plurality of substrates are capable of being arranged on a common circumference so as to establish an inner space circumscribed by said plurality of substrates, and a means for introducing a film-forming raw material gas into said inner space, wherein a first electrode for supplying a high frequency power into said inner space is provided at a central position in said inner space circumscribed by said plurality of substrates, a second electrode is provided outside said plurality of substrates arranged on said common circumference, and a shielding member at least a part of which being constituted by a dielectric material is provided between said second electrode and said plurality of substrates arranged on said common circumference such that said shielding member substantially shields said film-forming raw material gas so that said film-forming raw material gas is confined inside said shielding member and transmits a high frequency power supplied to said second electrode into said inner space.

A further object of the present invention is to provide a film-forming method comprising the steps of spacedly arranging a plurality of substrates on a common circumference in a reaction chamber capable of being vacuumed so as to establish an inner space circumscribed by said plurality of substrates in said reaction chamber, introducing a film-forming raw material gas into said inner space, and applying a high frequency power into said inner space, whereby plasma is generated to cause the formation of a deposited film on each of said plurality of substrates, wherein a first electrode is arranged at a central position in said inner space circumscribed by said plurality of substrates, a second electrode is arranged outside said plurality of substrates arranged on said common circumference, and a shielding member at least a part of which being constituted by a dielectric material is arranged between said second electrode and said plurality of substrates arranged on said common circumference to substantially shield said film-forming raw material gas so that said film-forming raw material gas is confined inside said shielding member and transmit a high frequency power supplied to said second electrode into said inner space while applying a high frequency power to said first electrode, whereby plasma is generated in said inner space to cause the formation of said deposited film on each substrate.

BRIEF DESCRIPTION OF THE DRAWINGS

FIG. 1 is a schematic diagram illustrating an example of a quantity production system for continuously forming a deposited film in the present invention.

FIG. 4 shows graphs in which results obtained in Example 4, which will be described later, are graphically shown.

DESCRIPTION OF THE INVENTION AND PREFERRED EMBODIMENTS

Figure 2A:
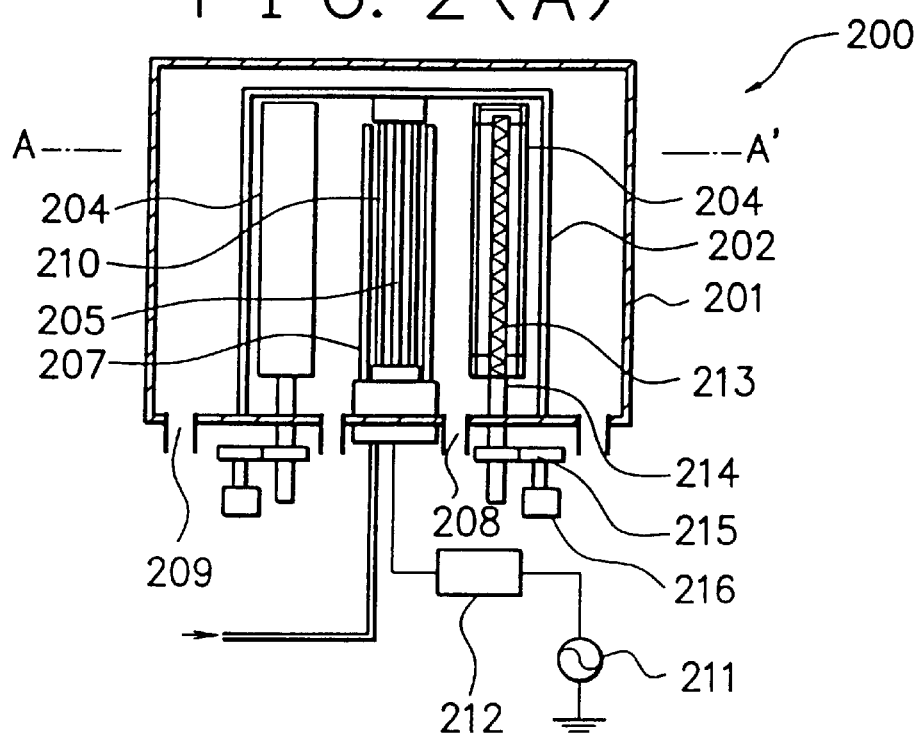
FIG. 2(A) is a schematic diagram illustrating an example of the constitution of a film-forming apparatus according to the present invention.

The present invention attains the foregoing objects. An aspect of the present invention is directed to a film-forming method by way of plasma CVD (hereinafter referred to as plasma CVD film-forming method) which enables to efficiently and continuously form a high quality deposited film having excellent characteristics. Another aspect of the present invention is directed to a film-forming apparatus by way of plasma CVD (hereinafter referred to as plasma CVD film-forming apparatus which enables to efficiently and continuously form a high quality deposited film having excellent characteristics, The plasma CVD film-forming method and apparatus according to the present invention enables to efficiently produce a high quality semiconductor device having an improved performance at a reasonable production cost. The semiconductor device can include a semiconductor circuit element, an electrophotographic light receiving member, an image input line sensor, an image pickup device, and a photovoltaic device (a solar cell)

As previously described, a typical embodiment of the plasma CVD film-forming method according to the present invention comprises the steps of spacedly arranging a plurality of substrates on a common circumference in a reaction chamber capable of being vacuumed so as to establish an inner space circumscribed by said plurality of substrates in said reaction chamber, introducing a film-forming raw material gas into said inner space, and applying a high frequency power into said inner space,whereby plasma is generated to cause the formation of a deposited film on each of said plurality of substrates, wherein a first electrode is arranged at a central position in said inner space circumscribed by said plurality of substrates, a second electrode is arranged outside said plurality of substrates arranged on said common circumference, and a shielding member at least a part of which being constituted by a dielectric material is arranged between said second electrode and said plurality of substrates arranged on said common circumference to substantially shield said film-forming raw material gas so that said film-forming raw material gas is confined inside said shielding member and transmit a high frequency power supplied to said second electrode into said inner space while applying a high frequency power to said first electrode, whereby plasma is generated in said inner space to cause the formation of said deposited film on each substrate.

A typical embodiment of the plasma CVD film-forming apparatus according to the present invention comprises a reaction chamber capable of being vacuumed and having a reaction space in which a plurality of substrates are capable of being arranged on a common circumference so as to establish an inner space circumscribed by said plurality of substrates, and a means for introducing a film-forming raw material gas into said inner space, wherein a first electrode for supplying a high frequency power into said inner space is provided at a central position in said inner space circumscribed by said plurality of substrates, a second electrode is provided outside said plurality of substrates arranged on said common circumference, and a shielding member at least a part of which being constituted by a dielectric material is provided between said second electrode and said plurality of substrates arranged on said common circumference such that said shielding member substantially shields said film-forming raw material gas so that said film-forming raw material gas is confined inside said shielding member and transmits a high frequency power supplied to said second electrode into said inner space.

The plasma CVD film-forming method according to the present invention may be conducted as will be described below.

A reaction chamber is provided with a gas feed means and an exhaust means and having a reaction space provided with a second electrode but no first electrode. The reaction space herein is configured as follows. A first electrode can be arranged at a central position in the reaction chamber, and a plurality of substrates for film formation can be arranged to circumscribe said first electrode so as to establish an inner space circumscribed by said substrates in the reaction space. The second electrode is installed in the reaction space such that the second electrode positions outside the arrangement of the substrates. And in the reaction chamber, a shielding member having a portion constituted by a dielectric material can be arranged between the arrangement of the substrates and the second electrode.

And there is provided an assembly comprising said first electrode and substrate holding means capable of holding said plurality of substrates such that they are arranged on a common circumference so as to circumscribe said first electrode, and said shielding member which is situated outside said substrate holding means to circumscribe said plurality of substrates to be held on said substrate holding means.

The assembly is positioned on a loading stage, and a plurality of substrates are loaded on the assembly where said substrates are held on the substrate holding means. Then, the assembly is moved to install in the reaction space of the reaction chamber such that the shielding member of the assembly is positioned between the second electrode of the reaction chamber and the substrates held on the substrate holding means, where a deposited film is formed on each of the substrates in the film-forming manner as described in the plasma CVD film-forming method. After this, the assembly is taken out from the reaction chamber, and it is moved into an unload chamber, where the substrates each having the deposited film formed thereon are unloaded from the assembly. The assembly with no substrate is moved into an etching chamber, where film materials deposited on the inside portions (including the first electrode) of the assembly during the film formation in the reaction chamber are removed by way of etching using an etching gas. The assembly thus treated is moved to the loading stage, where a plurality of substrates, which are stood by for next film formation, are loaded on the assembly in the same manner as above described, followed by subjecting to the above procedures. In this way, film formation is continuously conducted.

In the present invention, the oscillation frequency of the high frequency power used in the film formation is desired to be in the range of 50 to 450 MHz.

Further, for the gas pressure inside the shielding member (that is, the gas pressure in a space enclosed by the shielding member, which is continuous to the inner space) upon film formation in the present invention, it is desired to be 100 mTorr or less.

In the present invention, because the specific shielding member is installed in the reaction chamber as above described wherein the second electrode is not exposed to plasma generated in the reaction chamber, the second electrode is maintained without being directly deposited with a film as in the case of not using such shielding member where the second electrode is situated to expose to plasma generated in the reaction chamber. Therefore, the second electrode may be optionally designed as desired with respect to the curvature of its surface constituted by a dielectric material and the shape thereof, within a range of causing no loss in the high frequency power introduced through the second electrode. This situation provides such advantages as will be described in the following. The second electrode is desirably prevented from being deposited with a film which will peel off and contaminate into a film deposited on a substrate, and as a result, a high quality film having excellent properties can be efficiently formed, where particularly, a high quality electrophotographic light receiving member (or a high quality electrophotographic photosensitive device) which affords a high quality image free of a defect can be efficiently produced.

In addition, as apparent from the above description, in the present invention, by the shielding member, there are established a film-forming zone situated inside the shielding member and a non film-forming zone situated outside the shielding member in the reaction chamber such that said film-forming zone is isolated from said non film-forming zone, said film-forming zone (situated inside the shielding member) containing the substrates arranged to curcumscribe the first electrode and in which the film-forming raw material gas is confined, and said non film-forming zone (situated outside the shielding member) containing the second electrode. Hence, in the present invention, there is attained an improved raw material gas utilization efficiency which is higher than that in the case where such shielding member is not used, wherein such film-forming and non film-forming zones are not established.

In the following, the present invention will be detailed with reference to the drawings.

FIG. 1 is a schematic diagram illustrating an example of a quantity production system for continuously forming a deposited film in the present invention.

As shown in FIG. 1, reference numeral 106 indicates an assembly comprising a shielding member (corresponding to the foregoing shielding member) having at least a chucking mechanism (not shown) for chucking a cylindrical substrates 107 and an electrode holder (not shown) for holding a first electrode 108.

On a loading stage 101, a plurality of cylindrical substrates 107 are loaded on the assembly by detachably fixing them to the shielding member through the chucking mechanism and a first electrode 108 is loaded on the assembly by fixing it onto the electrode holder Then, using a transportation chamber 105 provided with a gate valve 110 and under vacuumed condition, the assembly is transported into a reaction chamber 102 having a reaction space having a plurality of second electrodes 109 installed therein, where the assembly is positioned in the reaction space such that the shielding member 107 (having the cylindrical substrates 107 and the first electrode 108) is situated inside the second electrodes 109 as shown in FIG. 1.

The reaction chamber 102 is provided with a gate valve 111 connected to a vacuum pump 112 through an exhaust pipe provided with a control valve 112', which is used upon transferring the assembly from the transportation chamber 105 into the reaction chamber 102 under vacuumed condition The reaction chamber 102 is also provided with an exhaust pipe connected through an exhaust valve 113' to a vacuum pump 113 for evacuating the inside of the reaction space. Although this is not shown in FIG. 1, the reaction chamber 102 is provided with means for introducing a film-forming raw material gas into the reaction space, and it is also provided with a power source for applying a high frequency power with a desired oscillation frequency to the first electrode 108 and the second electrodes 109.

In the reaction chamber 102, the formation of a deposited film on the cylindrical substrates 107 is conducted by introducing a film-forming raw material gas into the reaction space and simultaneously supplying a high frequency power with a desired oscillation into the reaction chamber through the first and second electrodes to generate plasma in the reaction space.

After the film formation, using the transportation chamber 105, the assembly is taken out from the reaction chamber 102, followed by transporting into an unload chamber 103, where only cylindrical substrates 114 each having a deposited film formed thereon are unloaded from the assembly by detaching them from the chucking mechanism of the shielding mechanism.

For the assembly comprising the shielding member 106 with the first electrode 108, using the transportation chamber 105, it is transported into an etching chamber 104, where films deposited on the inside portions (including the first electrode 108) of the assembly during the film formation in the reaction chamber 102 are removed by etching treatment using an etching gas comprising, for example, a fluorine-containing gas. The etching gas may be a gaseous plasma produced by subjecting a given etching gas to plasma discharge treatment.

The etching chamber 104 is provided with a gate valve 115 connected to a vacuum pump 116 through an exhaust pipe provided Smith a control valve 116', which is used upon transferring the assembly (comprising the shielding member 106 with the first electrode 108) from the transportation chamber 105 into the etching chamber 104 under vacuumed condition. The etching chamber 104 is also provided with an exhaust pipe connected through an exhaust valve 118 to a vacuum pump 117 for evacuating the inside of the etching chamber 104.

Although not shown in FIG. 1, the etching chamber 104 is provided with means for introducing an etching gas into the etching chamber 104. The etching chamber 104 is also provided with a mechanism for applying a discharging electric power for generating plasma in an etching gas (comprising, for example, a fluorine-containing gas in the etching chamber.

The assembly (comprising the shielding member 106 with the first electrode 108) thus treated in the etching chamber 104 is returned to the loading stage 101, where a plurality of cylindrical substrates 107, which are stood by for next film formation, are loaded on the assembly by detachably fixing them to the shielding member through the chucking mechanism, followed by subjecting the foregoing procedures. In this way, film formation is continuously conducted, where high quality deposited film products can be continuously produced at a satisfactory reproducibility, without being affected by residues in the reaction chamber and while desirably preventing occurrence of a problem in that films deposited on the inside portions of the reaction chamber are peeled to contaminate into a deposited film formed on the substrate. In addition, the inside of the reaction chamber is cleaned to be free of a film deposited thereon upon conducting the film formation as above described, the period of time required for the maintenance of the reaction chamber is markedly diminished, and because of this, the productivity of a deposited film is significantly improved.

In the present invention, for the oscillation frequency of the high frequency power applied to the first and second electrodes upon film formation, it is desired to be in the range of 50 to 450 MHz. In the case where the oscillation frequency is less than 50 MHz, by-products of silicon comprising so-called polysilanes are liable to deposit on the periphery of the dielectric portion of the shielding member. Such polysilanes are poor in adhesion. Even in the present invention, when the shielding member is arranged in close proximity to the cylindrical substrate and the dielectric portion of the shielding member is deposited with polysilanes, there is an occasion that those polysilanes are somewhat removed depending upon film-forming conditions employed, where they result in contaminating into a deposited film formed on the substrate, where the deposited film formed on the substrate is insufficient in terms of the film properties.

On the other hand, in the case where the oscillation frequency is beyond 450 MHz, when a large quantity of the high frequency power with such large oscillation frequency is supplied, there is an occasion that depending upon film-forming conditions employed, a film is readily deposited on the surface of the dielectric portion of the shielding member and the temperature of the surface of the dielectric portion of the shielding member is greatly increased, where the film deposited on the surface of the dielectric portion of the shielding member is partially greatly heated to crystallize When this situation occurs, a problem may arise in that the electric power is unevenly transmitted and adversely affects a deposited film formed on the substrate. In the case where the temperature of the surface of the dielectric portion of the shielding member is significantly increased the dielectric portion of the shielding member is damaged due to a thermal gradient.

In the present invention, to apply a high frequency power with an oscillation frequency in the range of 50 to 450 MHz to the first and second electrodes upon film formation is based on a finding of experimental studies conducted by the present inventors in that when a high frequency power with an oscillation frequency in the range of 50 to 450 MHz is applied to the first and second electrodes, the foregoing problems found in the prior art can be solved, and a high quality deposited film having excellent properties can be efficiently formed at a high yield and a high productivity.

And in the present invention, for the gas pressure (or the inner pressure) inside the shielding member (that is, the gas pressure (the inner pressure) in the space enclosed by the shielding member, which is continuous to the inner space), is desired to be 100 mTorr or less.

When the gas pressure inside the shielding member is beyond 100 mTorr, the composition of a film deposited on the shielding member becomes imperfect, and depending upon film-forming conditions employed, as the film deposition on the shielding member proceeds, the film deposited on the shielding member comes off and contaminates a deposited film formed on the substrate, causing the deposited film formed on the substrate to have insufficient in terms of the film properties.

On the other hand, if the gas pressure inside the shielding member is 100 mTorr or less, plasma is uniformly generated. In this case, the structure of a film deposited on the shielding member is uniform and because of this, there is little stress in the film deposited on the shielding member and the problem above described is prevented from occurring, resulting in efficiently forming a high quality deposited film having excellent properties on the substrate.

In the present invention, the bulk of the shielding member, which is provided between the second electrode and the substrates (the cylindrical substrates) arranged on the common circumference such that the film-forming raw material gas is substantially confined inside the shielding member, comprises an electrically conductive material of about 1 mm to about 10 mm in thickness. Such electrically conductive material can include metals such as Al, Cr, Mo, Au, In, Nb, Ni, Te, V, Ti, Pt, Pb, Fe and the like, or alloys of these metals such as stainless steels.

At least an inside face of the shielding member (constituted by any of these metallic materials) which is exposed to plasma generated in the inner space is desired to be applied with a sprayed coating of a ceramic in order to improve the adhesion with a film deposited thereon.

In addition, the shielding member should be designed to have a specific portion which is situated in the vicinity of the second electrode. The portion of the shielding member is required to be structured so that a high frequency power applied to the second electrode is sufficiently supplied into the shielding member through said portion, followed by transmitting into the inner space inside the shielding member, and the film-forming raw material gas is sufficiently prevented from leaking outside the shielding member through the portion and also preventing from invading into the shielding member through the portion. In order to satisfy these requirements, the portion of the shielding member which is situated in the vicinity of the second electrode is constituted by a dielectric material such as ceramics.

Figure 2B:
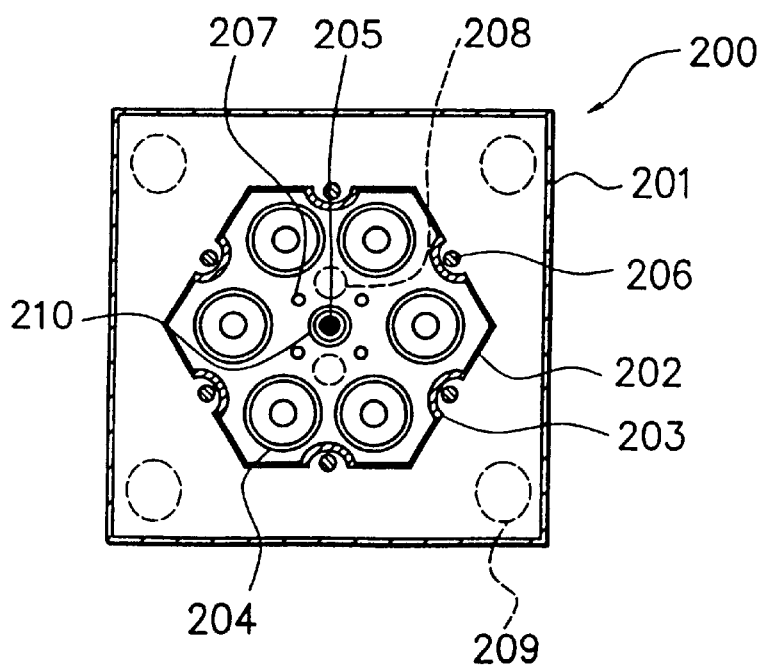
FIG. 2(B) is a schematic cross-sectional view taken along the A–A' line in FIG. 2(A).

FIG. 2(A) is a schematic diagram illustrating an example of the constitution of a plasma CVD film-forming apparatus according to the present invention. FIG. 2(B) is a schematic cross-sectional view, taken along the line A–A' in FIG. 2(A).

In FIGS. 2(A) and 2(B), reference numeral 200 indicates the entirety of a reaction chamber, reference numeral 201 a circumferential wall of the reaction chamber, reference numeral 202 a shielding member, reference numeral 203 a portion comprising a dielectric material (hereinafter simply referred to as dielectric portion) provided at the shielding member 202, reference numeral 204 a substrate (in a cylindrical form), reference numeral 205 a first electrode, reference numeral 206 a second electrode, reference numeral 207 a gas feed pipe connected to a raw material gas supply system, each of reference numerals 208 and 209 an exhaust port (an air exit) comprising an open end portion of an exhaust pipe provided with an exhaust valve (not shown) connected to an exhaust system having a vacuuming means (not shown), reference numeral 210 an electrode cover to cover the first electrode 205, reference numeral 211 a high frequency power source, reference numeral 212 a matching box, reference numeral 213 a heater (an electric heater) for heating the substrate 204, reference numeral 214 a rotary shaft on which the substrate 204 is held, reference numeral 215 a driving mechanism including a driving motor 216.

In the plasma CVD film-forming apparatus shown in FIGS. 2(A) and 2(B), a deposited film can be formed concurrently on six substrates. Specifically, as shown in FIGS. 2(A) and 2(B), six cylindrical substrates 204 are spacedly arranged on a common circumference to establish an inner space circumscribed by the cylindrical substrates 204 in the reaction chamber 200. It is possible for each of the cylindrical substrates 204 to be rotated by rotating the rotary shaft 114 by actuating the driving motor 216 to drive the driving mechanism 215. The formation of a deposited film on each of the cylindrical substrates 204 may be conducted by generating a plasma in the inner space circumscribed by the cylindrical substrates 204 while rotating the cylindrical substrates in the above described manner, thereby concurrently forming a deposited film uniformly on each of the cylindrical substrates.

In the plasma CVD film-forming apparatus shown in FIGS. 2(A) and 2(B), the shielding member 202 is provided so as to enclose the cylindrical substrates 204. The shielding member 202 is required to be of a size which can be housed in the reaction chamber 200 as shown in FIGS. 2(A) and 2(B). The shielding member 202 desirably has a supporting mechanism (not shown) which holds the cylindrical substrates 204.

The shielding member 202 is hermetically provided with a plurality of dielectric portions 203 (comprising a dielectric material) each being a part of the shielding member. Each dielectric portion 203 is desirably designed such that it situates between each adjacent cylindrical substrates 204 as shown in FIG. 2(B).

The bulk of the shielding member 202 [that is, the remaining constituent portions (other than the dielectric portions) of the shielding member 202] is constituted by an electrically conductive material.

The shielding member 202 is desirably to be designed such that a film forming raw material gas introduced into the reaction chamber 200 through the gas feed 107 is confined inside the shielding member. However, the upper portion of the shielding member 202 which is situated on the side opposite the exhaust side is not always necessary to be in a hermetical state.

As shown in FIG. 2(B), there are arranged a plurality of second electrodes 206 such that each second electrode corresponds to one of the dielectric portions 203 of the shielding member 204.

The first electrode 205 is arranged at a central position in the inner space circumscribed by the cylindrical substrates 204 so as to have an equal distance between the first electrode 205 and each of the cylindrical substrates 204. The first electrode 205 is protected by the electrode cover 210 provided to cover the first electrode.

In the inner space circumscribed by the cylindrical substrates 204, there are provided a plurality of gas feed pipes 207 about the electrode cover 210. The gas feed pipes 207 are connected to a gas supply pipe extended from a raw material gas supply system (not shown). Each of the gas feed pipes 207 is provided with a plurality of gas ejection holes (not shown) in the longitudinal direction.

As shown in FIGS. 2(A) and 2(B), the reaction chamber 200 is provided with a plurality of exhaust ports 208 (air exits) inside the shielding member 202 (that is, in the inside zone enclosed by the shielding member) and a plurality of exhaust ports 209 (air exits) between the shielding member 202 and the circumferential wall 201 (that is, in the outside zone outside the shielding member). Each exhaust port comprises an open end portion of an exhaust pipe (not shown) connected to an exhaust system having a vacuuming means (not shown). The inside of the reaction chamber 200 (that is, the foregoing inside and outside zones) may be evacuated to a desired vacuum degree through the exhaust ports 208 and 209.

The first electrode 205 is electrically connected to the high frequency power source 211 through the matching box 212 so that a high frequency power with a desired oscillation frequency can be supplied into the zone inside the shielding member 202. Each of the second electrodes 206 are also electrically connected to a high frequency power source (not shown) through a matching box (not shown) so that a high frequency power with a desired oscillation frequency can be applied to the second electrodes 206. The high frequency power applied to the second electrodes 206 is supplied into the zone inside the shielding member 202 through the dielectric portions 203 of the shielding member 202.

As shown in FIG. 2(B), there is space between the dielectric portion 203 of the shielding member 202 and the second electrode 206. However, in order to minimize the loss of the high frequency power, it is desired for the second electrode 206 to be substantially contacted with the dielectric portion 203.

For the dielectric portions 203 of the shielding member 202, the face of each dielectric portion on the side of the inner space circmscribed by the cylindrical substrates 204 (that is, the face of each dielectric portion which is exposed to plasma generated in the inner space and therefore, will be deposited with a film) is desirably applied with blast processing in order to improve its adhesion with the film deposited thereon.

As previously described, for the bulk of the shielding member 202 [that is, the remaining constituent portions (other than the dielectric portions) of the shielding member 202] constituted by the electrically conductive material, its inside face which is exposed to plasma generated in the inner space is desired to be applied with a sprayed coating of a ceramic in order to improve its adhesion with a film deposited thereon.

In the present invention, it is necessary to prevent plasma from generating in the outside zone between the circumferential wall 201 and the shielding member 202 due to the high frequency power from the second electrodes 206. For this purpose, the shielding member 202 is designed to have a hermetical structure which confines the film-forming raw material gas inside the shielding member without leaking the raw material gas outside the shielding member 202. However, this purpose can be attained by controlling the operation the apparatus. For instance, the inside of the outside zone between the shielding member 202 and the circumferential wall 201 is evacuated through the exhaust port 209 to a sufficiently high vacuum degree under which plasma is not generated. Besides, an appropriate inert gas such as He gas can be introduced into the outside zone, where the gas pressure in the outside zone is Trade higher than that in the inside zone inside the shielding member thereby preventing the film-forming raw material gas from leaking into the outside zone through the shielding member. Alternatively, the film-forming raw material gas, which should have been leaked into the outside zone through the shielding member, is diluted with the inert gas to prevent plasma from generating in the outside zone.

In the present invention, as previously described, the first electrode 205 for supplying a high frequency power into the inner space circumscribed by the cylindrical substrates 204 is desired to be arranged at a central position in the inner space such that a positional relationship of an equal distance is provided between the first electrode and each of the cylindrical substrates.

The first electrode 205 is constituted by an electrically conductive material. Such electrically conductive material can include metals such as Al, Cr, Mo, Au, In, Nb, Ni, Te, V, Ti, Pt, Pb, Fe and the like, or alloys of these metals such as stainless steels.

The surface of the first electrode 205 constituted by any of the foregoing metallic materials may be applied with a sprayed coating of a ceramic or covered by a ceramic in order to improve the adhesion with a film deposited thereon.

In the present invention, the second electrodes 206 are desired to be arranged outside the circumference formed by the centers of the cylindrical substrates 204 as shown in FIG. 2(B).

For the number of the second electrodes 206 used, there is no particular limitation. However, it is desired to be in the range of from a number equal to that of the cylindrical substrates 204 arranged to a number of about 3 times that of the cylindrical substrates 204 arranged in terms of attaining a uniform property for deposited films formed on the cylindrical substrates and also in terms of designing the apparatus. In any case, the second electrodes 206 are desired to be arranged such that each second electrode has the same positional relationship when viewed from the side of any of the cylindrical substrates.

In order for the high frequency power from each of the second electrodes 206 to be efficiently supplied into the inside zone inside the shielding member 202, each second electrode is desired to be arranged at a position in a space between each adjacent cylindrical substrates 204 arranged on the common circumference as shown FIG. 2(B).

like the first electrode 205, each of the second electrodes 206 is constituted by an electrically conductive material. Such electrically conductive material can include metals such as Al, Cr, Mo, Au, In, Nb, Ni, Te, V, Ti, Pt, Pb, Fe and the like, or alloys of these metals such as stainless steels.

Description will be made of film formation using the plasma CVD film-forming apparatus shown in FIGS. 2(A) and 2(B).

The formation of a deposited film using the plasma CVD film-forming apparatus shown in FIGS. 2(A) and 2(B) may be conducted, for instance, in the following manner.

Six well-cleaned cylindrical substrates 204 and the shielding member 202 are positioned in the reaction chamber 200 as shown in FIGS. 2(A) and 2(B).

The inside of the reaction chamber 200 is evacuated to a desired vacuum degree through the exhaust ports 208 and 209 by actuating the vacuuming means (not shown). By actuating the heaters 213, the cylindrical substrates 204 are heated to and maintained at a desired temperature. Film-forming raw material gases from the raw material gas supply system (not shown) are introduced into the inner space circumscribed by the cylindrical substrates 204 through the gas feed pipes 207, where due regard should be made so that there is no extreme change in the gas pressure in the inside zone enclosed by the shielding member 202. After the flow rate of each film-forming raw material gas becomes constant, the exhaust valves (not shown) are controlled to adjust not only the inner pressure (the gas pressure) in the inside zone but also the inner pressure (the gas pressure) in the outside zone outside the shielding member 202 as desired while observing vacuum gages (not shown) at respective desired values. After the inner pressures becomes constant, the high frequency power source 211 is switched on to apply a high frequency power with a desired frequency and having a desired wattage to the first electrode 205 through the matching box 212. Similarly, a high frequency power with a desired frequency and having a desired wattage is applied to the second electrodes 206. By this, discharging energy is supplied into the inner space, where plasma discharge occurs in the film-forming raw material gases introduced into the inner space, thereby the film-forming raw material gases are decomposed to cause the formation of a deposited film on each of the cylindrical substrates 204. After the completion of the film formation, the application of the high frequency power to the first and second electrodes is terminated, and the introduction of the film-forming raw material gases is terminated. In the case of forming a stacked structure comprising a plurality of deposited films (a plurality of layers) on each of the cylindrical substrates 204, the above procedures are repeated.

Figure 3:
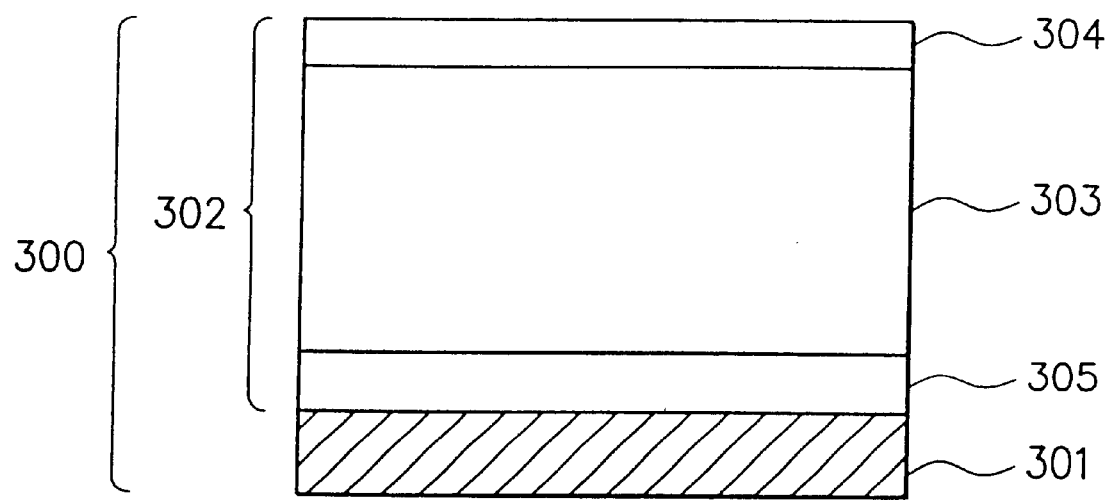
FIG. 3 is a schematic cross-sectional view illustrating an example of an electrophotographic light receiving member produced in the present invention.

FIG. 3 is a schematic cross-sectional view illustrating an example of the configuration of an electrophotographic light receiving member (or an electrophotographic photosensitive device) produced in the present invention.

In FIG. 3, reference numeral 300 indicates the entirety of an electrophotographic light receiving member (hereinafter simply referred to as light receiving member).

The light receiving member 300 comprises a light receiving layer 302 provided on a substrate 301 for a light receiving member. The light receiving layer 302 comprises a charge injection inhibition layer 305, a photoconductive layer 303, and a surface layer 304 stacked in the named order on the substrate 301. The charge infection inhibition layer 305 is not always necessary, and therefore, it may be omitted as desired.

In the following, description will be made of each constituent of the light receiving member 300.

Substrate

The substrate 301 may be either electrically conductive or electrically insulative.

The electrically conductive substrate can include, for example, metals such as Al, Cr, Mo, Au, In, Nb, Te, V, Ti, Pt, Pd, and Fe; and alloys of these metals such as stainless steels.

The electrically insulative substrate can include, for example, films or sheets of synthetic resins such as polyester, polyethylene, polycarbonate, cellulose acetate, polypropylene, polyvinyl chloride, polystyrene and polyamide, glass or ceramics. Any of these films or sheets is desired to be applied with electroconductive treatment to at least a surface thereof on which a deposited film as a light receiving layer of a light receiving member is to be formed. In this case, the remaining surface may be also applied with electroconductive treatment.

The substrate may be of any configuration such as cylindrical, plate-like or belt-like shape having a smooth or irregular surface.

The thickness of the substrate, should be properly determined so that a desired light receiving member can be produced. In the case where flexibility is required for the light receiving member, it can be made as thin as possible within a range capable of sufficiently providing the function as the substrate. However, the thickness is usually made to be greater than 10 μm in view of the fabrication and handling or mechanical strength of the substrate.

It is possible for the substrate to have an uneven surface. For instance, in the case where image formation is conducted using coherent monochromatic light such as laser beams, the substrate may have an uneven surface provided with irregularities in order to prevent the occurrence of defective images caused by a so-called interference fringe pattern being apt to appear in a visible image formed. Such uneven surface of the substrate may be formed by a conventional manner described in Japanese Unexamined Patent Publication No. 168156/1985, 178457/1985, or 225854/1985.

The irregularities of the uneven surface of the substrate may be based on a plurality of spherical dimples. Particularly, the irregularities may comprise a plurality of spherical dimples whose sizes are smaller than the resolution required for a light receiving member (that is, an electrophotographic light receiving member). The formation of the irregularities based on such spherical dimples at a surface of the substrate may be conducted by a conventional manner described in Japanese Unexamined Patent Publication No 231561/1986.

Light Receiving Layer

As previously described, the light receiving layer 302 basically comprises the photoconductive layer 303 and the surface layer 304. If necessary, the charge injection inhibition layer 305 is interposed between the substrate 301 and the photoconductive layer 303.

The photoconductive layer 303 may comprise an amorphous silicon material containing silicon atoms (Si) as a matrix and hydrogen atoms (H) or/and halogen atoms (X) (hereinafter referred to as "a-Si:(H,X)") and having photoconductivity.

The surface layer 304 may comprise an appropriate amorphous silicon series material. The charge injection inhibition layer 305 may also comprise an appropriate amorphous silicon series material.

In the following, description will be made of the formation of each constituent layer of the light receiving layer 302 in the production of a light receiving member having such configuration as above described.

Photoconductive Layer 303:

In order to form, for instance, an amorphous silicon (a-Si) deposited film as the photoconductive layer 303, an appropriate raw material in the gaseous state capable of supplying Si is used. Such raw material can include, for example, gaseous or gasifiable silicon hydrides (silanes). Specific examples are $SiH_4$, $Si_2H_6$, $Si_3H_8$, $Si_4H_{10}$, etc. of these, $SiH_4$ and $Si_2H_6$ are particularly preferred in view of the easy layer forming work and the good efficiency for the supply of Si. These Si-supplying compounds may be used either singly or in combination with two or more of them.

Besides, gaseous or gasifiable fluorine-containing silicon compounds, namely, fluorine-substituted silane derivatives, such as $SiF_4$ and $Si_2F_6$, and gaseous or gasitiable fluorine-substituted silicon hydrides such as $SiH_3F$, $SiH_2F_2$, and $SiHF_3$ are also usable as the Si-supplying raw material. These Si-supplying compounds may be used either singly or in combination with two or more of them.

If necessary, any of the above mentioned Si-supplying raw materials may be diluted with an appropriate dilution gas such as $H_2$ gas, He gas, Ar gas, or Ne gas.

The amorphous silicon deposited film as the photoconductive layer 303 may contain a dopant comprising atoms of a conductivity controlling element belonging to group IIIb of the periodic table which provide a p-type conductivity (this atoms will be hereinafter referred to as group IIIb atoms) or atoms of a conductivity controlling element belonging group Vb of the periodic table which provide an n-type conductivity (these atoms will be hereinafter referred to as group Vb atoms).

In order for the amorphous silicon deposited film as the photoconductive layer 303 to contain such a dopant, an appropriate raw material capable of supplying group IIIb or Vb atoms is used in addition to the foregoing Si-supplying raw material.

Such group IIIb or Vb atoms-supplying raw material can include raw materials capable of supplying group IIIb or Vb atoms, which are in the gaseous state at room temperature or can be easily gasified at least under the conditions for the formation of the deposited film.

Such group IIIb atoms-supplying gaseous or gasifiable raw material can include boron hydrides such as $B_2H_6$, and $B_4H_{10}$, and boron halides such as $BF_3$, and $BCl_3$.

Such group Vb atoms-supplying gaseous or gasifiable raw material can include phosphorous hydrides such as $PH_3$ and $P_2H_4$. and phosphorous halides such as $PH_4I$, $PF_3$, $PCl_3$, $PBr_3$, and $PI_3$.

Any of these group IIIb or Vb atoms- supplying raw materials may be diluted with a dilution gas such as $H_2$ gas, He gas or the like, if necessary.

The thickness of the photoconductive layer 303, it should be properly determined having due regards not only to the electrophotographic characteristics desired for the resulting electrophotographic light receiving member but also on economic effects. In view of this, it is preferably in the range of 15 to 50 $\mu$m, more preferably in the range of 20 to 45 $\mu$m, or most preferably in the range of 25 to 40 $\mu$m.

In order to form a photoconductive layer (comprising an amorphous silicon (a-Si) material) having desired properties capable of attaining the object of the present, invention it is necessary that the mixing ratio of the Si-supplying raw material gas and the dilution gas, the gas pressure (the inner pressure) in the reaction chamber (that is, in the inside zone enclosed by the shielding member), the discharging power, and the substrate temperature upon layer formation are properly adjusted depending upon the requirements involved.

For the flow rate the dilution gas (comprising $H_2$ gas, He gas, or a mixture of these gases), its optimum range should be determined in accordance with a previously established layer design. However, in general, the flow rate of the dilution gas is desired to be preferably in the range of 1 to 20 times, more preferably in the range of 2 to 15 times, most preferably in the range of 3 to 10 times, respectively versus the flow rate of the Si-supplying raw material gas.

For the gas pressure in the inside zone enclosed by the shielding member in the reaction chamber, it is desired to be 100 mTorr or less in order to obtain a high quality deposited film as the photoconductive layer. When the gas pressure is excessively low, disadvantages in terms of the productivity and the stability of plasma discharge are liable to result. In view of this, it is preferably in the range of 3 to 100 mtorr, more preferably in the range of 10 to 80 mTorr.

For the discharging power, its optimum range should be also determined in accordance with the previously established layer and also the configuration of the apparatus used. However, in general, in order to attain a sufficient deposition rate and desired characteristics for a deposited film formed, it is desired to be preferably in the range of 2 to 20 times, more preferably in the range of 2.5 to 10 times, most preferably in the range of 3 to 5 times, respectively versus the flow rate of the Si-supplying raw material gas.

For the substrate temperature, its optimum range should also be determined in accordance with the previously established layer design. However, in general, it is desired to be preferably in the range of 200 to 350° C., more preferably in the range of 230 to 330° C., most preferably in the range of 250 to 310° C.

However, the actual conditions for forming a desired deposited film as the photoconductive layer 303, such as the substrate temperature and the gas pressure in the inside zone enclosed by the shielding member in the reaction chamber, cannot usually be determined with ease dependently of each other. Accordingly, the conditions optimal to the film formation are desirably determined based on relative and organic relationships for forming a deposited film having desired properties suitable as the photoconductive layer 303.

Surface Layer 304:

The surface layer 304 may comprise an appropriate amorphous silicon series material. As preferable examples of such amorphous silicon series material, there can be mentioned, an amorphous silicon carbide (hereinafter referred to as "a-SiC"), an amorphous silicon material containing carbon atoms (C) and hydrogen atoms (H) or/and halogen atoms (X) (hereinafter referred to as "a-SiC:(H,X)"), an amorphous silicon material containing oxygen atoms (O) and hydrogen atoms (H) or/and halogen atoms (X) (hereinafter referred to as "a-SiO:(H,X)"), an amorphous silicon material containing nitrogen atoms (N) and hydrogen atoms (H) or/and halogen atoms (X) (hereinafter referred to as "a-SiN:(H,X)"), and an amorphous silicon material containing at least two kinds of atoms selected from the group consisting of carbon atoms (C), oxygen atoms (O) and nitrogen atoms (N), and hydrogen atoms (H) or/and halogen atoms (X) (hereinafter referred to as "a-SiCON:(H,X)").

The surface layer 304 may be formed by means of a vacuum deposition film-forming manner under film-forming conditions previously established so that a deposited film having desired properties as the surface layer can be formed. However, in view of the productivity of a light receiving member (an electrophotographic light receiving member) produced, it is desired for the surface layer 304 to be formed in the same manner forming the photoconductive layer 303. The foregoing film-forming conditions for the formation of the photoconductive layer 303 can be employed in the formation of the surface layer 304.

As above described, the surface layer 304 may comprise any amorphous silicon series material. However, in a preferred embodiment, the surface layer comprises an amorphous silicon material containing at least one kind of atom selected from the carbon atoms (C), oxygen atoms (O) and nitrogen atoms (N) such as a-SiC, a-SiC:(H,X), a-SiO:(H, X), a-SiN:(H,X), or a-SiCON:(H,X). In the most preferred embodiment, the surface layer comprises a-SiC.

As a raw material gas capable of supplying Si which is used in the formation of the surface layer, there can be mentioned, for example, gaseous or gasifiable silicon hydrides (silanes). Specific examples are $SiH_4$, $Si_2H_6$, $Si_3H_8$, $Si_4H_{10}$, etc. Of these, $SiH_4$ and $Si_2H_6$ are particularly preferred in view of the easy layer forming work and the good efficiency for the supply of Si. These Si-supplying compounds may be used either singly or in combination with two or more of them.

If necessary, any of the above mentioned Si-supplying raw materials may be diluted with an appropriate dilution gas such as $H_2$ gas, He gas, Ar gas, or Ne gas.

As a raw material gas capable of supplying C (carbon atoms) which is used in the formation of the surface layer, there can be mentioned, for example, gaseous or gasifiable hydrocarbons, $CH_4$, $C_2H_6$, $C_3H_8$, $C_4H_{10}$, and the like. of these, $CH_4$ and $C_2H_6$ are particularly preferred in view of the easy layer forming work and the good efficiency for the supply of C. These C-supplying compounds may be used either singly or in combination with two or more of them.

If necessary, any of the above mentioned C-supplying raw materials may be diluted with an appropriate dilution gas such as $H_2$ gas, He gas, Ar gas, or Ne gas.

As a raw material gas capable of supplying O (oxygen atoms) which is used in the formation of the surface layer, there can be mentioned, for example, $O_2$, $O_3$, NO, $NO_2$, $N_2O_3$, and the like. As a raw material gas capable of supplying N (nitrogen atoms) which is used in the formation of the surface layer, there can be mentioned, for example, $N_2$, $NH_3$, $HN_3$, $H_2NNH_2$, $NH_3N_3$, and the like. Any of these raw materials may be diluted with an appropriate dilution gas such as $H_2$ gas, He gas, Ar gas, or Ne gas.

For the thickness of the surface layer 304, it is preferably in the range of 0.01 to 3 µm, more preferably in the range of 0.05 to 2 µm, or most preferably in the range of 0.1 to 1 µm. In the case where the surface layer is a thickness of less than 0.01 µm, the surface layer is lost due to abrasion or the like during repeated use of the light receiving member. On the other hand, in the case where the surface layer is of a thicker than 3 µm, deterioration of the electrophotographic characteristics, such as an increase in the residual potential, occurs.

Charge Injection Inhibition Layer 305:

The charge injection inhibition layer 305 may comprise an amorphous silicon series material containing atoms of a conductivity controlling element as well as the photoconductive layer 303.

The charge injection inhibition layer 305 has a rectification property of preventing a charge carrier from being injected from the substrate side into the photoconductive layer 303 when one polarity charge is applied on the surface of the light receiving layer 302 and of not exhibiting said function when the other polarity charge is applied. Thus, the charge injection inhibition layer has so-called polarity dependency.

In order for the charge injection inhibition layer to have such function as above described, the charge injection inhibition layer is incorporated with atoms of a conductivity controlling element (hereinafter referred to as "conductivity controlling atoms") in a relatively large amount in comparison with that of the dopant (comprising the conductivity controlling atoms) contained in the photoconductive layer 303

The charge injection inhibition layer 305 may contain the conductivity controlling atoms such that they are evenly contained in the entire layer region in terms of the concentration distribution.

Alternatively, it is possible for the charge injection inhibition layer to contain the conductivity controlling atoms in the thickness direction at a uniform concentration distribution, where the charge injection inhibition layer has a partial layer region containing the conductivity controlling atoms at an uneven concentration distribution.

In the case where the concentration distribution of the conductivity controlling atoms contained in the charge injection inhibition layer is uneven, it is desired for the concentration distribution to be enhanced on the substrate side.

However, in any case, it is necessary for the conductivity controlling atoms to be evenly contained in the in-plane direction in parallel to the surface of the substrate at a uniform concentration distribution, in order for the charge injection inhibition layer to have uniform properties in the in-plane direction.

As the conductivity controlling atoms contained in the charge injection inhibition layer, so-called impurities in the field of the semiconductor can be mentioned, and those usable herein can include atoms of elements belonging to group IIIb of the periodic table which provide a p-type conductivity (these elements will be hereinafter referred to as group IIIb element) and atoms of elements belonging to group Vb of the periodic table which provide an n-type conductivity (these elements will be hereinafter referred to as group Vb element).

Specific examples of the group IIIb element are B, Al, Ga, In, and Tl. Of these elements, B, Al and Ga are particularly preferable. Specific examples of the group Vb elements are P, As, Sb, and Bi. Of these elements, P and As are particularly preferable.

For the amount of the conductivity controlling atoms contained in the charge injection inhibition layer, it is preferably in the range of from 10 to $1\times10^4$ atomic ppm, more preferably in the range of from 50 to $5\times10^3$ atomic ppm, or most preferably in the range of from $1\times10^2$ to $1\times10^3$ atomic ppm.

The charge injection inhibition layer may contain at least one kind of atom selected from the group consisting of carbon atoms (C), nitrogen atoms (N) and oxygen atoms (O) [hereinafter referred to as "atoms(C,N,O)"]. In this case, the adhesion of the charge injection inhibition layer with the photoconductive layer is improved.

The charge injection inhibition layer 305 may contain the atoms (C,N,O) such that they are evenly contained in the entire layer region in terms of the concentration distribution.

Alternatively, it is possible for the charge injection inhibition layer to contain the atoms (C,N,O) in the thickness direction at a uniform concentration distribution, where the charge injection inhibition layer has a partial layer region containing the atoms (C,N,O) at an uneven concentration distribution.

However, in any case, it is necessary for the atoms (C,N,O) to be evenly contained in the in-plane direction in parallel to the surface of the substrate at a uniform concentration distribution, in order for the charge injection inhibition layer to have uniform properties in the in-plane direction.

For the thickness of the charge injection inhibition layer 305, it should be properly determined having due regards not only for the electrophotographic characteristics desired for the resulting electrophotographic light receiving member, but also for economic effects. In view of this, it is preferably in the range of 0.1 to 5 µm. more preferably in the range of 0.3 to 4 µm, or most preferably in the range of 0.5 to 3 µm.

The charge injection inhibition layer 305 may be formed in accordance with the foregoing manner for the formation of the photoconductive layer 303 Particularly, as well as in the case of forming the photoconductive layer 303, in order to form a charge injection inhibition layer (comprising an amorphous silicon material) having desired properties, the mixing ratio of the Si-supplying raw material gas and the dilution gas, the gas pressure (the inner pressure) in the reaction chamber (that is, in the inside zone enclosed by the shielding member), the discharging power, and the substrate temperature upon layer formation are properly adjusted depending upon the requirements involved.

For the flow rate the dilution gas (comprising $H_2$ gas, He gas, or a mixture of these gases), its optimum range should be determined in accordance with a previously established layer design. However, in general, the flow rate of the dilution gas is desired to be preferably in the range of 1 to 20 times, more preferably in the range of 3 to 15 times, most preferably in the range of 5 to 10 times, respectively versus the flow rate of the Si-supplying raw material gas.

For the gas pressure in the inside zone enclosed by the shielding member in the reaction chamber, it is desired to be 100 mTorr or less in order to obtain a high quality deposited film as the charge injection inhibition layer. When the gas pressure is excessively low, disadvantages in terms of the productivity and the stability of plasma discharge are liable to result. In view of this, it is preferably in the range of 3 to 100 mTorr, more preferably in the range of 10 to 80 mtorr.

For the discharging power, its optimum range should be also determined in accordance with the previously established layer and also the configuration of the apparatus used. However, in general, it is preferably in the range of 1 to 7 times, more preferably in the range of 2 to 6 times, most preferably in the range of 3 to 5 times, respectively versus the flow rate of the Si-supplying raw material gas.

For the substrate temperature, its optimum range should be also determined in accordance with the previously established layer design. However, in general, it is preferably in the range of 200 to 350° C., more preferably in the range of 230 to 330° C., most preferably in the range of 250 to 310° C.

In the following, the features and advantages of the present invention will be described in more detail with reference to examples, but the scope of the present invention is not restricted by these examples.

EXAMPLE 1

In this example, using the plasma CVD film-forming apparatus shown in FIGS. 2(A) and 2(B) and under conditions shown in Table 1, there were prepared a plurality of electrophotographic light receiving members having a three-layered light receiving layer (comprising a charge injection inhibition layer, a photoconductive layer and a surface layer stacked in the named order) of the configuration shown in FIG. 3 in the following manner.

Six cylindrical substrates 204 made of aluminum of 358 mm in length, 80 mm in outer diameter and 5 mm in thickness and having a well-cleaned mirror-finished surface were positioned together with the shielding member 202 in the reaction chamber 200 as shown in FIGS. 2(A) and 2(B).

The inside of the reaction chamber 200 was evacuated to a vacuum degree of 50 mTorr by actuating the vacuuming means (not shown). Specifically, the inside of the inside zone enclosed by the shielding member 202 was evacuated to 5.0 mTorr through the exhaust ports 208, and simultaneously, the outside zone between the shielding member 202 and the circumferential wall 201 was evacuated to 5.0 mTorr through the exhaust port 209.

Then, by actuating the heaters 213, the cylindrical substrates 204 were heated to and maintained at 250° C. Thereafter, $SiH_4$ gas, $H_2$ gas, and $B_2H_6$ gas from the raw material gas supply system (not shown) were introduced into the inner space circumscribed by the cylindrical substrates 204 through the gas feed pipes 207 at respective flow rates of 300 sccm, 100 sccm and 500 ppm (against the $SiH_4$ gas). After the flow rate of each film-forming raw material gas became constant at said flow rate, the exhaust valves (not shown) for the exhaust ports 208 were controlled to adjust the inner pressure (the gas pressure) in the inside zone to 20 mTorr. Herein, the inner pressure (the gas pressure) in the outside zone was maintained at 5.0 mtorr. After the inner pressure in the inside zone became constant at said 20 mTorr, the high frequency power source 211 was switched on to apply a high frequency power (of 500 W) with an oscillation frequency of 105 MHz to the first electrode 205 through the matching box 212. At the same time, a high frequency power (of 300 W) with an oscillation frequency of 105 MHz was applied to the second electrodes 206 in the same manner, where discharging energy was supplied into the inner space to create plasma discharge in the film-forming raw material gases introduced into the inner space, whereby the film-forming raw material gases were decomposed to cause the formation of a 2 μm thick amorphous silicon deposited film as a charge injection inhibition layer on each of the cylindrical substrates 204. In this case, the film formation was conducted without rotating the cylindrical substrates 204. The film-forming conditions herein are shown in Table 1.

After the formation of the charge injection inhibition layer on each of the cylindrical substrates 204, the application of the high frequency power to the first and second electrodes were terminated, and the introduction of the film-forming raw material gases was terminated.

The above procedures for the formation of the charge injection inhibition layer were repeated, except that the film-forming conditions were changed to those shown in the column "photoconductive layer" of Table 1, to form a 30 μm thick amorphous silicon deposited film as a photoconductive layer on the charge injection inhibition layer previously formed on each of the cylindrical substrates 204.

Then, the above procedures for the formation of the charge injection inhibition layer were repeated, except that the film-forming conditions were changed to those shown in the column "surface layer" of Table 1, to form a 2 μm thick amorphous silicon deposited film as a surface layer on the photoconductive layer previously formed on each of the cylindrical substrates 204.

Thus, there were obtained six electrophotographic light receiving members having a three-layered light receiving layer (comprising a charge injection inhibition layer, a photoconductive layer and a surface layer stacked in the named order) of the configuration shown in FIG. 3.

Evaluation

For each of the six electrophotographic light receiving members (the electrophotographic light receiving member will be hereinafter referred to as "light receiving member) obtained in the above, evaluation was conducted with respect to (1) appearance of defective image, (2) evenness in halftone reproduction, (3) photosensitivity, (4) evenness in photosensitivity, and (5) evenness in charge retentivity with respect to temperature, using a modification of a commercially available electrophotographic apparatus NP 6750 (product of CANON Kabushiki Kaisha), modified for experimental purposes.

Each of the evaluation items (1) to (5) was conducted in the following manner. The evaluated results are collectively shown in Table 3.

1. Evaluation of the Appearance of Defective Image (1):

Each of the six light receiving members is set to the above electrophotographic apparatus, wherein an original comprising a halftone test chart FY9-9042 (produced by CANON Kabushiki Kaisha) in which the entire area comprises a halftone image is positioned on the original table of the electrophotographic apparatus, and the halftone test chart is subjected to reproduction to obtain a copied image. Of the copied images obtained using the six light receiving members, one which is worst in terms of the quality is examined as follows. The number of white spots having a diameter of 0.5 mm or less present in the copied image is examined.

The examined result is shown in Table 3 based on the following criteria.

⊚: a case wherein the number of the white spots is 0 to 2, which can be absolutely disregarded, ○: a case wherein the number of the white spots is 3 to 5, which can be disregarded, Δ: a case wherein the number of the white spots is 6 to 10, which is acceptable in practice, and X: a case wherein the number of the white spots is more than 11, which is practically unacceptable.

2. Evaluation of the Evenness in Halftone Reproduction (2)

Each of the six light receiving members is set to the above electrophotographic apparatus, wherein an original comprising a halftone test chart FY9-9042 (produced by CANON Kabushiki Kaisha) in which the entire area comprises a halftone image is positioned on the original table of the electrophotographic apparatus, and the halftone chart is subjected to reproduction at an exposure value which is two times the ordinary exposure value to obtain a copied image. Of the copied images obtained using the six light receiving members, one which is worst in terms of the quality is examined as follows. 100 circular portions of 5 mm in diameter are randomly selected, the optical density of each circular portion is measured, and a mean value among the measured values is obtained. Of the measured value, for one which is the most distant from the mean value, a proportion thereof to the mean value is obtained. The resultant proportion is made to be evenness in halftone reproduction.

The result obtained is shown in Table 3 based on the following criteria.

⊚: a case wherein the proportion is less than 3%,

○: a case wherein the proportion is in the range of 3% to less than 10%,

Δ: a case wherein the proportion is in the range of 10% to less than 20%, and

X: a case wherein the proportion is more than 20%.

3. Evaluation of the Photosensitivity (3):

Each of the six light receiving members is set to the above electrophotographic apparatus, wherein the light receiving member is subjected to charging so as to provide a predetermined surface potential in dark, followed by irradiation of light from a Xenon lamp while excluding light having a wavelength of more than 600 nm by means of a cut-filter, wherein photocarriers are generated in the light irradiated portion of the light receiving member to attenuate the surface potential. The surface potential (that is, the surface potential in light) of the light receiving member is measured by means of an electrostatic voltmeter. And the quantity of exposure light is so adjusted that the surface potential in light becomes a predetermined value. The quantity of the exposure light used is made to be a photosensitivity of the light receiving member. Herein, the smaller the quantity of the exposure light, the greater the photosensitivity.

This measurement is conducted at selected surface portions of the light receiving member at an interval of 3 cm in the up-and-down direction- For the measured values obtained, a mean value is obtained, and the value which is the most distant from the mean value is made to a photosensitivity of the light receiving member. This evaluation is conducted for all the six light receiving members. The one which is worst in terms of the photosensitivity is shown in Table 3 based on the following criteria.

⊚: a case wherein the light receiving member is excellent in photosensitivity uniformity, ○: a case wherein the light receiving member is good enough in photosensitivity uniformity, Δ: a case wherein the light receiving member is not so good in photosensitivity uniformity but is practically applicable, and X: a case wherein the light receiving member is relatively inferior and would be sometimes practically problematic.

4. Evaluation of the Evenness in Photosensitivity:

For the six mean values (these six mean values will be hereinafter simply referred to as "six values") for the six light receiving members which were obtained in the above 4, there is obtained a mean value. Of the six values, for one which is the most distant from the mean value, a proportion thereof to the mean value is obtained. The resultant proportion is made to an evenness in photosensitivity of the batch comprising the six light receiving members.

The result obtained is shown in Table 3 based on the following criteria.

⊚: a case wherein the proportion is less than 3%, which is excellent,

○: a case wherein the proportion is in the range of 3% to less than 5%, which is good enough, Δ: a case wherein the proportion is in the range of 5% to less than 10%, which is not so good but practically applicable, and X: a case wherein the proportion is more than 10%, which is relatively inferior and would be sometimes practically problematic.

5. Evaluation of the Evenness in Charge Retentivity with Respect to Temperature:

Each of the six light receiving members is set to the above electrophotographic apparatus, wherein the light receiving member is subjected to charging so as to provide a predetermined surface potential in dark, followed by changing the temperature of the light receiving member from room temperature to about 45° C., where a charge retentivity of the light receiving member is measured every time when 1° C. is increased. For the measured values, a mean value (hereinafter referred to as "first mean value") is obtained. This measurement is conducted at selected surface portions of the light receiving member at an interval of 3 cm in the up-and-down direction. By this, there are obtained a plurality of first mean values. For the first values obtained, a mean value (hereinafter referred to as "second mean value") is obtained. For the first mean values, one and the value which is the most distant from the second mean value is made to be a charge retentivity of the light receiving member.

For all the six light receiving members, this evaluation is conducted to obtain a charge retentivity for each of the six light receiving members.

For the resultant six charge retentivities, there is obtained a mean value. Of the six charge retentivities, for one which is the most distant from the mean value, a proportion thereof to the mean value is obtained. The resultant proportion is made to an evenness in charge retentivity with respect to temperature of the batch comprising the six light receiving members.

The result obtained is shown in Table 3 based on the following criteria.

⊚: a case wherein the proportion is less than 3%, which is excellent,

○: a case wherein the proportion is in the range of 3% to less than 5%, which is good enough, Δ: a case wherein the proportion is in the range of 5% to less than 10%, which is not so good but practically applicable, and X: a case wherein the proportion is more than 10%, which is relatively inferior and would be sometimes practically problematic.

As the results shown in Table 3 illustrate, it is understood that all the electrophotographic light receiving members are excellent in all the evaluation items.

COMPARATIVE EXAMPLE 1

Figure 6A:
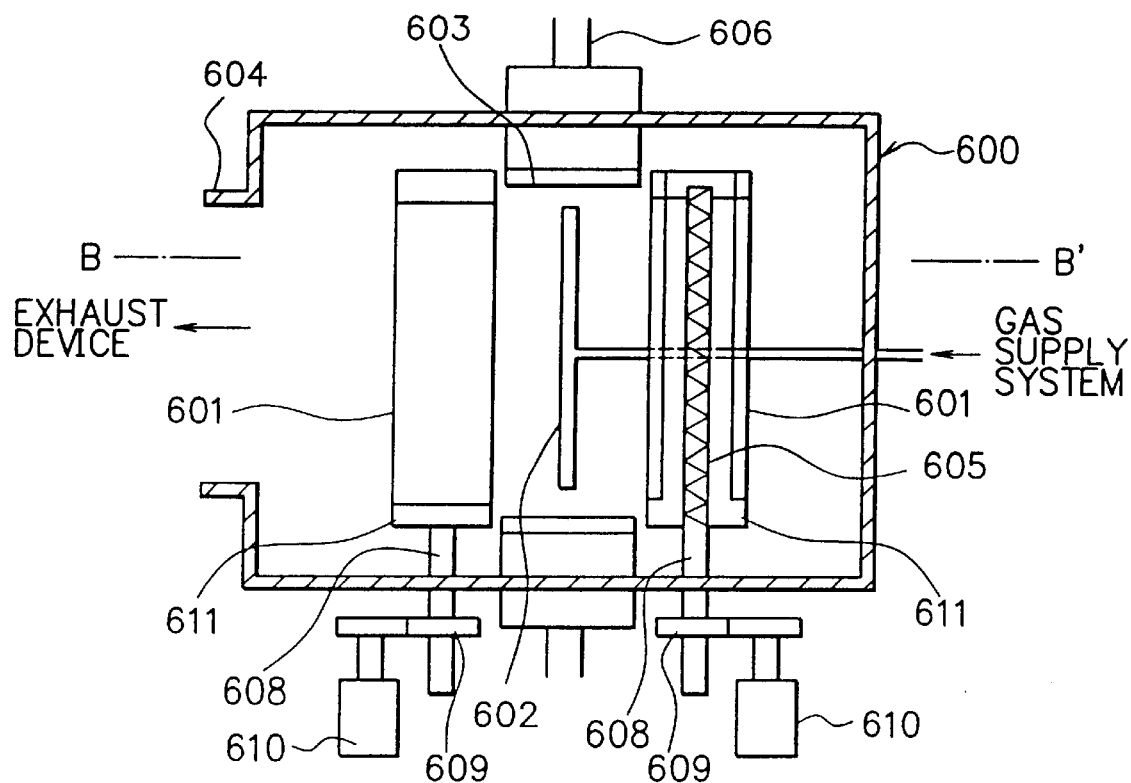
FIG. 6(A) is a schematic diagram illustrating a film-forming apparatus used in comparative examples which will be described later.
Figure 6B:
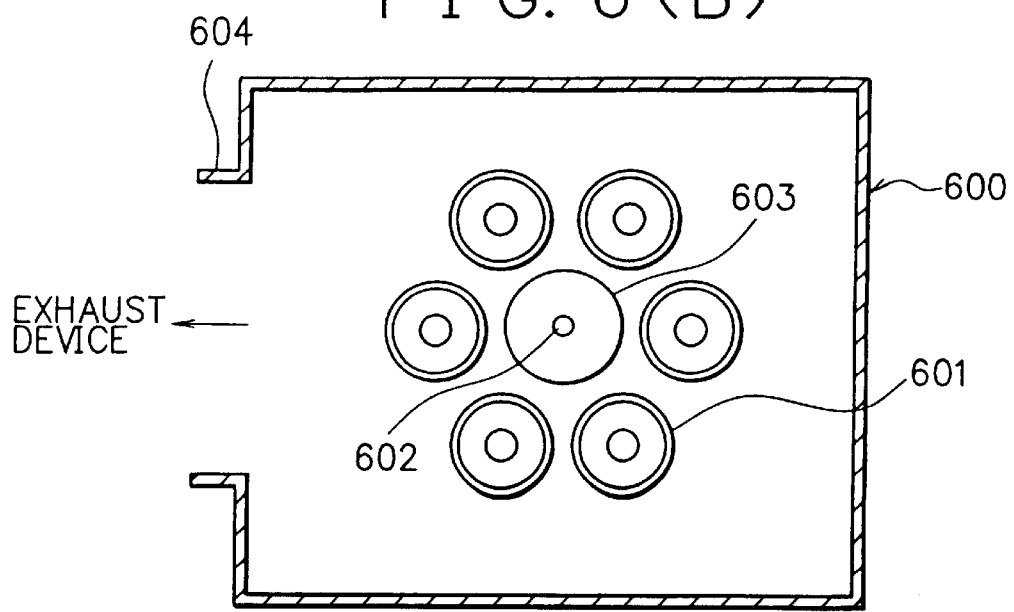
FIG. 6(B) is a schematic cross-sectional view taken along the B–B' line in FIG. 6(A).

In this comparative example, there was used a plasma CVD (a microwave plasma CVD) film-forming apparatus with no shielding member, as shown in FIGS. 6(A) and 6(B).

FIG. 6(A) is a schematic diagram illustrating said plasma CVD film-forming apparatus, and FIG. 6(B) is a cross-sectional view, taken along the line B–B' in FIG. 6(A).

In FIGS. 6(A) and 6(B), reference numeral 600 indicates a reaction chamber, reference numeral 601 a cylindrical substrate positioned on a substrate holder 611 (having a heater 605 installed therein) held by a rotary shaft 608 connected to a driving motor 610 through a driving mechanism 609, and reference numeral 602 a gas feed pipe having a plurality of gas ejection holes (not shown) and capable of serving also as a plasma controlling electrode. The gas feed pipe 602 is connected to a raw material gas supply system (not shown) through a conduit. Reference numeral 603 indicates a microwave introducing window hermetically provided at the circumferential wall of the reaction chamber 600. The microwave introducing window 603 is hermetically provided at a waveguide 606 extending from a microwave power source (not shown). The reaction chamber 600 is provided with an exhaust pipe 604 connected through an exhaust valve (not shown) to an exhaust device comprising a vacuum pump (not shown).

The reaction chamber 600 has a reaction space in which a plurality of cylindrical substrates 601 are spacedly arranged so as to establish an inner space (a discharge space) circumscribed by said cylindrical substrate as shown in FIG. 6(B).

Using the plasma CVD film-forming apparatus shown in FIGS. 6(A) and 6(B) and under conditions shown in Table 2, there were prepared a plurality of electrophotographic light receiving members having a three-layered light receiving layer (comprising a charge injection inhibition layer, a photoconductive layer and a surface layer stacked in the named order) of the configuration shown in FIG. 3 in the following manner.

Six cylindrical substrates 601 made of aluminum of 358 mm in length, 80 mm in outer diameter and 5 mm in thickness and having a well-cleaned mirror-finished surface were positioned on the substrate holders 611 in the reaction chamber 600.

The inside of the reaction chamber 600 was evacuated to a desired vacuum through the exhaust pipe 604 by actuating the exhaust device (not shown). Then, by actuating the heaters 213, the cylindrical substrates 204 were heated to and maintained at 250° C. Thereafter, $SiH_4$ gas, $H_2$ gas, and $B_2H_6$ gas from the raw material gas supply system (not shown) were introduced into the inner space circumscribed by the cylindrical substrates 601 through the gas feed pipes 602 at respective flow rates of 300 sccm, 100 sccm and 500 ppm (against the $SiH_4$ gas) After the flow rate of each film-forming raw material gas became constant at said flow rate, the exhaust valve (not shown) of the exhaust pipe 604 was controlled to adjust the inner pressure (the gas pressure) in the reaction chamber 600 to 30 mTorr.

After the inner pressure (the gas pressure) in the reaction chamber 600 became constant at said 30 mTorr, the microwave power source (not shown) was switched on to apply a microwave power high frequency power (of 500 W) with an oscillation frequency of 2450 MHz into the inner space circumscribed by the cylindrical substrates 601 from each of the opposite sides of the inner space through the waveguide 603 and the microwave introducing window 603, where discharging energy was supplied into the inner space to create plasma discharge in the film-forming raw material gases introduced into the inner space The film-forming raw material gases were thereby decomposed to cause the formation of a 2 µm thick amorphous silicon deposited film as a charge injection inhibition layer on each of the cylindrical substrates 601. In this case, each of the cylindrical substrates 601 was rotated through the driving mechanism 609 by actuating the driving motor 610. The film-forming conditions herein are shown in Table 2.

After the formation of the charge injection inhibition layer on each of the cylindrical substrates 601, the application of the microwave power was terminated, and the introduction of the film-forming raw material gases was terminated.

The above procedures for the formation of the charge injection inhibition layer were repeated, except that the film-forming conditions were changed to those shown in the column "photoconductive layer" of Table 2, to form a 30 µm thick amorphous silicon deposited film as a photoconductive layer on the charge injection inhibition layer previously formed on each of the cylindrical substrates 601.

Then, the above procedures for the formation of the charge injection inhibition layer were repeated, except that the film-forming conditions were changed to those shown in the column "surface layer" of Table 2, to form a 2 µm thick amorphous silicon deposited film as a surface layer on the photoconductive layer previously formed on each of the cylindrical substrates 601.

Thus, there were obtained six electrophotographic light receiving members having a three-layered light receiving layer (comprising a charge injection inhibition layer, a photoconductive layer and a surface layer stacked in the named order) of the configuration shown in FIG. 3.

Evaluation

For each of the six electrophotographic light receiving members obtained in the above, evaluation was conducted with respect to (1) appearance of defective image, (2) evenness in halftone reproduction, (3) photosensitivity, (4) evenness in photosensitivity, and (5) evenness in charge retentivity with respect to temperature in the same manner as in Example 1.

The evaluated results are collectively shown in Table 3.

On the basis of the results shown in Table 3, it is understood that the batch comprising the six electrophotographic light receiving members obtained in Example 1 belonging to the present invention, which were prepared by the plasma CVD film-forming apparatus having the shielding member without rotating the cylindrical substrates, surpasses the batch comprising the six electrophotographic light receiving members obtained in Comparative Example 1, which were prepared by the microwave plasma CVD film-forming apparatus having no shielding member while rotating the cylindrical substrates, with respect to all the evaluation items.

EXAMPLE 2

The procedures of Example 1 were repeated 11 times, except that the inner pressure (the gas pressure) in the inside zone enclosed by the shielding member upon the formation of the light receiving layer was changed to 3.0 mTorr, 5.0 mTorr, 10.0 mTorr, 20.0 mTorr, 50.0 mTorr, 80.0 mTorr, 100 mTorr, 120.0 mTorr, 150.0 mTorr, 200.0 mTorr, or 500 mTorr (see, Table 4) in each case, to obtain 11 batches each comprising six electrophotographic light receiving members having a three-layered light receiving layer (comprising a charge injection inhibition layer, a photoconductive layer and a surface layer stacked in the named order) of the configuration shown in FIG. 3

For each of the 11 batches obtained, evaluation was conducted with respect to (1) appearance of defective image, (2) evenness in halftone reproduction, (3) photosensitivity, (4) evenness in photosensitivity, and (5) evenness in charge retentivity with respect to temperature in the same manner as in Example 1.

The evaluated results are collectively shown in Table 4.

As the results shown in Table 4 illustrate, it is understood that when the inner pressure (the gas pressure) in the inside zone enclosed by the shielding member upon the formation of the light receiving layer is made to be 100 mTorr or less, there can be efficiently obtained high quality electrophotographic light receiving members excelling in the all the evaluation items

EXAMPLE 3

The procedures of Example 1 were repeated 11 times, except that the oscillation frequency of the high frequency power applied to the first and second electrodes upon the formation of the light receiving layer was changed to 10 MHz, 13.56 MHz, 30 MHz, 50 MHz, 80 MHz, 200 MHz, 400 MHz, 450 MHz, 500 MHz, 1000 MHz, or 2450 MHz (see, Table 5) in each case, to obtain 11 batches each comprising six electrophotographic light receiving members having a three-layered light receiving layer (comprising a charge injection inhibition layer, a photoconductive layer and a surface layer stacked in the named order) of the configuration shown in FIG. 3.

For each of the 11 batches obtained, evaluation was conducted with respect to (1) appearance of defective image, (2) evenness in halftone reproduction, (3) photosensitivity, (4) evenness in photosensitivity, and (5) evenness in charge retentivity with respect to temperature in the same manner as in Example 1.

The evaluated results are collectively shown in Table 5. In Table 5, the evaluated results obtained in Example 1 are also shown.

As the results shown in Table 5 illustrate, it is understood that when the oscillation frequency of the high frequency power applied to the first and second electrodes upon the formation of the light receiving layer is made to be in the range of 50 MHz to 450 MHz, there can be efficiently obtained high quality electrophotographic light receiving members excelling in the all the evaluation items evaluated.

EXAMPLE 4

In this example, using the quantity production system shown in FIG. 1 and the conditions employed in Example 1, there were continuously produced 100 batches each comprising six electrophotographic light receiving members having a three-layered light receiving layer (comprising a charge injection inhibition layer, a photoconductive layer and a surface layer stacked in the named order) of the configuration shown in FIG. 3

There was provided a shielding member 106 (corresponding to the foregoing shielding member) having at least a chucking mechanism (not shown) for chucking a cylindrical substrates 107 and an electrode holder (not shown) for holding a first electrode 108.

On the loading stage 101, six cylindrical substrates 107 made of aluminum of 358 mm in length, 80 mm in outer diameter and 5 mm in thickness and having a well-cleaned mirror-finished surface were detachably fixed to the shielding member through the chucking mechanism and a first electrode 108 was fixed onto the electrode holder, whereby obtaining an assembly comprising the shielding member 106 having the cylindrical substrates 107 and the first electrode 108 therein. Then, the assembly was introduced into the transportation chamber 105, and the transportation chamber 105 containing the assembly therein was transported to a position just above the reaction chamber 102 having the reaction space having the second electrodes 109 installed therein. At this time, the inside of the transportation chamber 105 was maintained at a desired vacuum degree by means of vacuuming means (not shown), and the inside of the reaction chamber 102 was maintained at the same vacuum degree of the transportation chamber 105 by means of the vacuum pump 113. The transportation chamber 105 was then moved to contact with the reaction chamber 102, where the gate valve 110 was face-to-face contacted with the gate valve 111 of the reaction chamber 102 to be sealed. Thereafter, the vacuum pump 112 for the gate valve 111 of the reaction chamber 102 was actuated to evacuate a clearance between the gate valve 110 of the transportation chamber 105 and the gate valve 111 to make said clearance air-tight. The two gate valves were opened and the assembly was moved into the reaction chamber 102 from the transportation chamber 105.

After this, the two gate valves 110 and 111 were closed, and the transportation chamber was returned to home position.

The assembly thus transported into the reaction chamber 102 was positioned in the reaction space of the reaction chamber such that the shielding member 107 (having the cylindrical substrates 107 and the first electrode 108) was situated inside the second electrodes 109 as shown in FIG. 1.

Herein, as previously described, the reaction chamber 102 is provided with means for introducing a film-forming raw material gas into the reaction space, and it is also provided with a power source for applying a high frequency power with a desired oscillation frequency to the first electrode 108 and the second electrodes 109.

In the reaction chamber 102, film formation on each of the cylindrical substrates 107 was conducted in the same manner as in Example 1 under the conditions shown in Table 1, where a three-layered light receiving layer (comprising a charge injection inhibition layer, a photoconductive layer and a surface layer stacked in the named order) was formed on each of the cylindrical substrates 107. The cylindrical substrates 107 (that is, the six cylindrical substrates) are six cylindrical electrophotographic light receiving members (hereinafter referred to as cylindrical light receiving members)

After this, using the transportation chamber 105, the assembly was taken out from the reaction chamber 102, followed by transporting into the unload chamber 103, where only the cylindrical substrates 114 (that is, the cylindrical light receiving members) were unloaded from the assembly by detaching them from the chucking mechanism of the shielding mechanism.

For the assembly comprising the shielding member 106 with the first electrode 108, using the transportation chamber 105, it was transported into the etching chamber 104 in accordance with the foregoing manner of transporting the assembly from the transportation chamber 105 into the reaction chamber 102, where films deposited on the inside portions (including the first electrode 108) of the assembly during the film formation in the reaction chamber 102 were removed by etching treatment using an etching gas comprising $ClF_3$ gas.

The assembly (comprising the shielding member 106 with the first electrode 108) thus treated in the etching chamber 104 was returned to the loading stage 101, where six cylindrical substrates 107 made of aluminum of 358 mm in length, 80 mm in outer diameter and 5 mm in thickness and having a well-cleaned mirror-finished, which stood by for next film formation, were fixed to the shielding member 106 of the assembly, followed by the foregoing procedures.

In this way, there were continuously produced 100 batches each comprising six electrophotographic light receiving members having a three-layered light receiving layer (comprising a charge injection inhibition layer, a photoconductive layer and a surface layer stacked in the named order) of the configuration shown in FIG. 3.

For each of the resultant 100 batches, evaluation was conducted with respect to (1) appearance of defective image, (2) evenness in halftone reproduction, (3) photosensitivity, (4) evenness in photosensitivity, and (5) evenness in charge retentivity with respect to temperature in the same manner as in Example 1.

The evaluated results with respect to each of the five evaluation items (1) to (5) are graphically shown in FIG. 4. In FIG. 4, there are shown five graphs each for one of the five evaluation items. In each graph, the abscissa indicates the number of the production cycle, and the vertical axis indicates a relative value to the value of a given evaluation item for the first batch (produced in the first production cycle), which is set at 100.

As the graphs shown in FIG. 4 illustrate, it is understood that all the batches continuously produced are quite satisfactory in all the evaluation items and all of them are stable in terms of the quality.

COMPARATIVE EXAMPLE 2

The procedures of Comparative Example 1 were continuously repeated 100 times to produce 100 batches each comprising six electrophotographic light receiving members having a three-layered light receiving layer (comprising a charge injection inhibition layer, a photoconductive layer and a surface layer stacked in the named order) of the configuration shown in FIG. 3.

For each of the resultant 100 batches, evaluation was conducted with respect to (1) appearance of defective image, (2) evenness in halftone reproduction, (3) photosensitivity, (4) evenness in photosensitivity, and (5) evenness in charge retentivity with respect to temperature in the same manner as in Example 1

Figure 5:
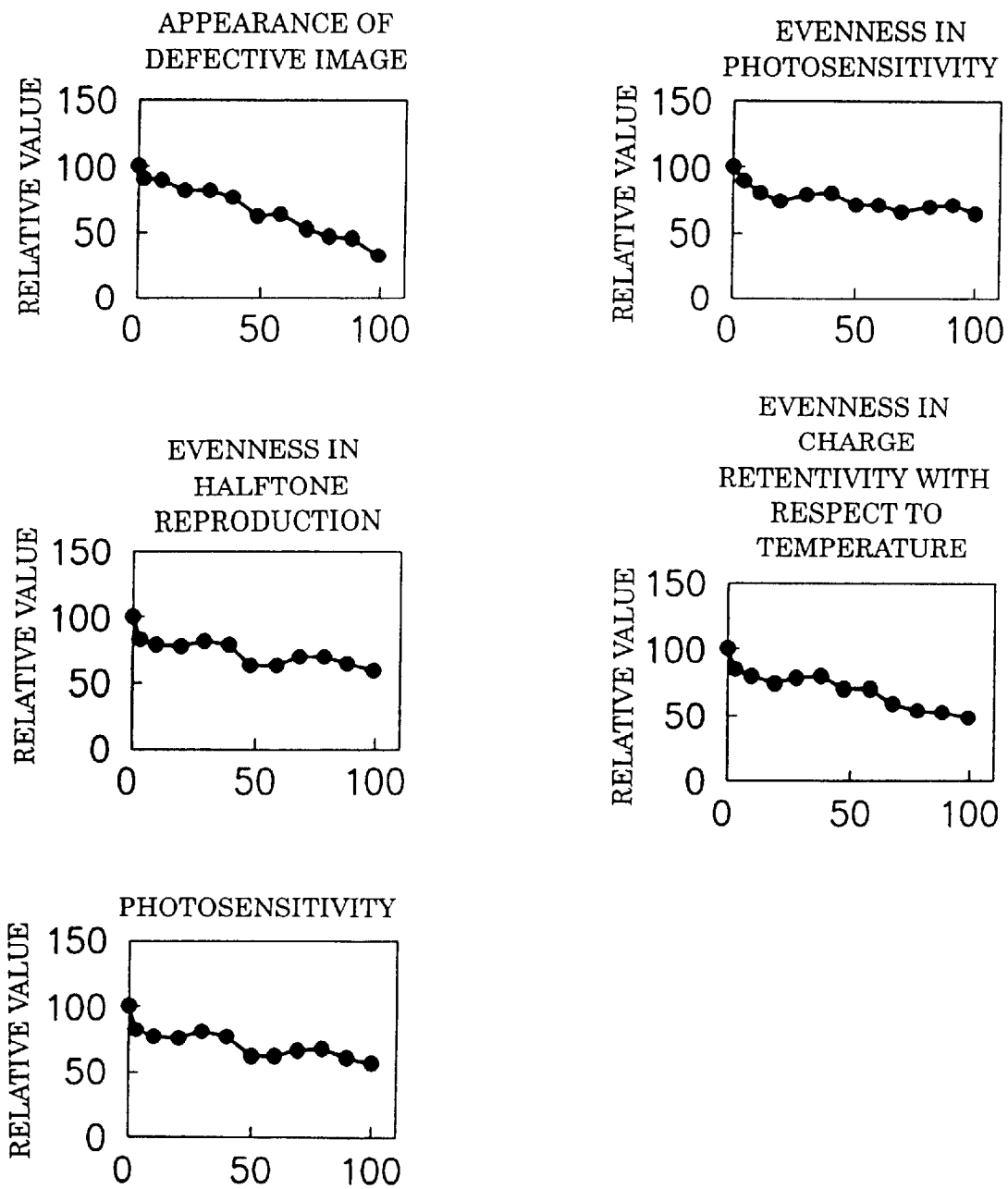
FIG. 5 shows graphs in which results obtained in Comparative Example 4, which will be described later, are graphically shown.

The evaluated results with respect to each of the five evaluation items (1) to (5) are graphically shown in FIG. 5. In FIG. 5, there are shown five graphs each for one of the five evaluation items. In each graph, the abscissa indicates the number of production cycle, and the vertical axis indicates a relative value to the value of a given evaluation item for the first batch (produced in the first production cycle), which is set at 100.

As the graphs shown in FIG. 5 illustrate, it is understood that as the production cycle is increased, the quality of a batch produced is gradually deteriorated.

Now, as apparent from the above description, the present invention in which the specific shielding member is used as previously described provides various advantages. That is, foreign matter including films deposited on materials other than a substrate (on which a deposited film is formed) during film formation by way of a plasma CVD process are effectively prevented from contaminating into a deposited film formed on the substrate. This enables efficient and continuous formation of a high quality deposited film having excellent properties at a high yield. Particularly, it is possible to efficiently and continuously produce a batch comprising a plurality of electrophotographic light receiving members which are substantially uniform in terms of the electrophotographic characteristics and capable of stably and continuously reproduced high quality images free of defects.

Specifically, as previously described, in the present invention, the shielding member (at least a part of which being constituted by the dielectric material) is arranged in the reaction chamber (that is, the deposition chamber) so as to establish an inside zone (which is enclosed by the shielding member) and an outside zone (which is situated outside the shielding member) in the reaction chamber; said inside zone comprising a space in which a substrate is positioned and plasma glow discharge is caused in the presence of a film-forming raw material gas to form a deposited film on said substrate, wherein the raw material gas is confined within said inside zone by the shielding member which prevents the raw material gas from leaking into said outside zone; said outside zone comprising a space between the shielding member and the circumferential wall of the reaction chamber. Because of this, the utilization efficiency of a film-forming raw material gas used for film formation is significantly improved, and a high quality deposited film having excellent properties can be efficiently and stably formed at a high productivity and a reasonable production cost.

Further, as previously described, in the present invention, the shielding member can be designed so that a plurality of substrates for film formation are detachably fixed thereto. By applying the shielding member thus designed in a quantity production system comprising the loading stage for fixing a plurality of substrates for film formation to the shielding member, the reaction chamber for forming a deposited film on each of said substrates, the unloading chamber for detaching the substrates each having the deposited film formed thereon from the shielding member, and the etching chamber for cleaning the shielding member having no substrate, it is possible to continuously mass-produce a batch comprising a plurality of deposited film products which are substantially uniform in terms of quality.

TABLE 1

| | | layer formed | | | |
|---|---|---|---|---|---|
| | | charge injection inhibition layer | photoconductive layer | surface layer | |
| raw material gas and its flow rate | | $SiH_4$ 300 $H_2$ 100 $B_2H_6$ 500 ppm (against $SiH_4$) | $SiH_4$ 300 $B_2H_6$ 2.0 ppm (against $SiH_4$) | $SiH_4$ $H_2$ $CH_4$ | 20 200 400 |
| conditions | | | | | |
| inner pressure (mTorr) | inside zone* | 20.0 | 20.0 | 20.0 | |
| | outside zone** | 5.0 | 5.0 | 5.0 | |
| high frequency power (W) | first electrode | 500 | 500 | 500 | |
| | second electrode | 300 | 300 | 300 | |
| oscillation frequency | first electrode | 105 MHz | 105 MHz | 105 MHz | |
| | second electrode | 105 MHz | 105 MHz | 105 MHz | |

*: the inside zone enclosed by the shielding member
**: the outside zone between the shielding member and the circumferential wall of the reaction chamber

TABLE 2

| | layer formed | | |
|---|---|---|---|
| | charge injection inhibition layer | photoconductive layer | surface layer |
| raw material gas and its flow rate conditions | $SiH_4$ 300<br>$H_2$ 100<br>$B_2H_6$ 500 ppm (against $SiH_4$) | $SiH_4$ 300<br>$B_2H_6$ 2.0 ppm (against $SiH_4$) | $SiH_4$ 20<br>$H_2$ 200<br>$CH_4$ 400 |
| inner pressure (mTorr) | 30.0 | 30.0 | 30.0 |
| microwave power (W) | 500 | 500 | 500 |
| oscillation frequency of microwave power | 2450 MHz | 2450 MHz | 2450 MHz |
| bias voltage applied | 80 V | 80 V | 80 V |

TABLE 3

| | appearance of defective image | evenness in halftone reproduction | photosensitivity | evenness in photosensitivity | evenness in charge retentivity with respect to temperature |
|---|---|---|---|---|---|
| Example 1 | ⊚ | ⊚ | ⊚ | ⊚ | ⊚ |
| Comparative Example 1 | Δ | ○ | ○ | Δ | ○ |

TABLE 4

| inner pressure* (mTorr) | appearance of defective image | evenness in halftone reproduction | photosensitivity | evenness in photosensitivity | evenness in charge retentivity with respect to temperature |
|---|---|---|---|---|---|
| 3.0 | ⊚ | ⊚ | ⊚ | ⊚ | ⊚ |
| 5.0 | ⊚ | ⊚ | ⊚ | ⊚ | ⊚ |
| 10.0 | ⊚ | ⊚ | ⊚ | ⊚ | ⊚ |
| 20.0 | ⊚ | ⊚ | ⊚ | ⊚ | ⊚ |
| 50.0 | ⊚ | ⊚ | ⊚ | ⊚ | ⊚ |
| 80.0 | ⊚ | ⊚ | ⊚ | ⊚ | ⊚ |
| 100.0 | ⊚ | ⊚ | ⊚ | ⊚ | ⊚ |
| 120.0 | ○ | ○ | ○ | ○ | ○ |
| 150.0 | ○ | Δ | ○ | Δ | Δ |
| 200.0 | Δ | Δ | Δ | Δ | Δ |
| 500.0 | Δ | Δ | Δ | Δ | Δ |

*: the inside zone enclosed by the shielding member

TABLE 5

| oscillation frequency (MHz) | appearance of defective image | evenness in halftone reproduction | photosensitivity | evenness in photosensitivity | evenness in charge retentivity with respect to temperature |
|---|---|---|---|---|---|
| 10 | Δ | Δ | ○ | ○ | Δ |
| 13.56 | ○ | ○ | ○ | ○ | ○ |
| 30 | ○ | ○ | ○ | ○ | ○ |
| 50 | ⊚ | ⊚ | ⊚ | ⊚ | ⊚ |
| 80 | ⊚ | ⊚ | ⊚ | ⊚ | ⊚ |
| 105 (Example 1) | ⊚ | ⊚ | ⊚ | ⊚ | ⊚ |
| 200 | ⊚ | ⊚ | ⊚ | ⊚ | ⊚ |
| 400 | ⊚ | ⊚ | ⊚ | ⊚ | ⊚ |
| 450 | ⊚ | ⊚ | ⊚ | ⊚ | ⊚ |
| 500 | ○ | ○ | ○ | ○ | ○ |
| 1000 | Δ | ○ | ○ | ○ | ○ |
| 2450 | Δ | Δ | Δ | Δ | Δ |

What is claimed is:

1. A film-forming apparatus comprising a substantially enclosed reaction chamber having a reaction space in which a plurality of substrates are capable of being arranged on a common circumference so as to establish an inner space circumscribed by said plurality of substrates, and a means for introducing a film-forming raw material gas into said inner space,
wherein a first electrode for supplying a high frequency power into said inner space is provided at a central position in said inner space circumscribed by said plurality of substrates, a second electrode is provided outside said plurality of substrates arranged on said common circumference, and a shielding member having a dielectric portion constituted by a dielectric material is provided between said second electrode and said plurality of substrates arranged on said common circumference such that said shielding member substantially shields said film-forming raw material gas so that said film-forming raw material gas is confined inside said shielding member and transmits a high frequency power supplied to said second electrode into said inner space.

2. A film-forming apparatus according to claim 1, wherein the position of the dielectric portion of the shielding member corresponds to the position of the second electrode.

3. A film-forming apparatus according to claim 1, wherein the position of the dielectric portion of the shielding member corresponds to a position between adjacent substrates.

4. A film-forming apparatus according to claim 1, where the position of the dielectric portion of the shielding member and the position of the second electrode correspond to a position between adjacent substrates.

5. A film-forming apparatus according to claim 1, wherein the shielding member has a function of holding the substrates.

6. A film-forming apparatus according to claim 5, wherein the shielding member has also a function of holding the first electrode.

7. A film-forming apparatus according to claim 5, wherein the shielding member is capable of being taken into or out from the reaction chamber.

8. A film-forming apparatus according to claim 5 which includes a loading means for loading the substrates to the shielding member prior to introducing the substrates into the reaction chamber and a unloading chamber for unloading the substrates each having a deposited film formed thereon in the reaction chamber from the shielding member.

9. A film-forming apparatus according to claim 8 which further comprises a transportation chamber for transporting the shielding member to the reaction chamber or the unloading chamber.

10. A film-forming apparatus according to claim 8 which further comprises an etching chamber capable of accommodating the shielding member from which the substrates are unloaded by the unloading chamber and which serves to clean the shielding member.

11. A film-forming apparatus according to claim 1, wherein the reaction chamber is provided with an inside zone enclosed by the shielding member and an outside zone situated outside the shielding member, and each of said inside and outside zones is provided with an exhaust port for evacuating said inside zone or said outside zone.

12. A film-forming apparatus according to claim 1, wherein the substrates comprise cylindrical substrates.

13. A film-forming apparatus according to claim 1 which has a high frequency power source capable of applying a high frequency power with an oscillation frequency of 50 MHz to 450 MHz to each of the first and second electrodes.

14. A film-forming apparatus comprising a substantially enclosed reaction chamber having a reaction space in which a plurality of substrates are capable of being arranged on a common circumference so as to establish an inner space circumscribed by said plurality of substrates and a means for introducing a film-forming raw material gas into said inner space, wherein a first electrode for supplying a high frequency power into said inner space is provided at a central position in said inner space circumscribed by said plurality of substrates, a shielding member is provided outside said common circumference in said reaction chamber, and a second electrode is provided outside said shielding member in said reaction chamber, wherein said second electrode is positioned so as not to be exposed to glow discharge in said inner space.

15. A film-forming apparatus comprising a substantially enclosed reaction chamber having a reaction space in which a plurality of substrates are capable of being arranged on a common circumference so as to establish an inner space circumscribed by said plurality of substrates and a means for introducing a film-forming raw material gas into said inner space, wherein a first electrode for supplying a high frequency power into said inner space is provided at a central position in said inner space circumscribed by said plurality of substrates, a shielding member is provided outside said common circumference in said reaction chamber, and a second electrode is provided outside said shielding member in said reaction chamber, wherein said second electrode is positioned so as to not be exposed to glow discharge in said inner space and wherein said shielding member is removable.

* * * * *

UNITED STATES PATENT AND TRADEMARK OFFICE
CERTIFICATE OF CORRECTION

PATENT NO.   : 6,336,423 B1
DATED        : January 8, 2002
INVENTOR(S)  : Ryuji Okamura et al.

It is certified that error appears in the above-identified patent and that said Letters Patent is hereby corrected as shown below:

<u>Title page,</u>
Item [75], Inventors, "Souraku-gun;" should read -- Soura-gun; --.

<u>Column 1,</u>
Line 11, "CVD")" should read -- CVD"). --;
Line 32, "use" should read -- use. --; and
Line 60, "apparatus)" should read -- apparatus). --.

<u>Column 2,</u>
Line 18, "ununiform" should read -- nonuniform --;
Line 19, "ununiformness" should read -- nonuniformity --;
Line 52, "using." should read -- used. --;
Line 66, "miniaturized" should read -- miniaturized. --; and
Line 67, "be have a" should read -- have --.

<u>Column 3,</u>
Line 1, "indeed" should be deleted.

<u>Column 4,</u>
Line 32, "characteristics," should read -- characteristics. --.

<u>Column 5,</u>
Line 67, "stood" should read -- standing --.

<u>Column 7,</u>
Line 50, "Smith" should read -- with --.

<u>Column 8,</u>
Line 1, "stood" should read -- standing --; and
Line 42, "crystallize" should read -- crystallize. --.

<u>Column 9,</u>
Line 6, "in terms" should be deleted; and
Line 7, "of the" should be deleted.

UNITED STATES PATENT AND TRADEMARK OFFICE
CERTIFICATE OF CORRECTION

PATENT NO. : 6,336,423 B1
DATED : January 8, 2002
INVENTOR(S) : Ryuji Okamura et al.

It is certified that error appears in the above-identified patent and that said Letters Patent is hereby corrected as shown below:

Column 11,
Line 58, "Trade" should read -- made --.

Column 12,
Line 37, "like" should read -- Like --.

Column 13,
Line 3, "became" should read -- become --;
Line 33, "infection" should read -- injection --; and
Line 60, "substrate," should read -- substrate --.

Column 14,
Line 20, "No" should read -- No. --; and
Line 56, "gasitiable" should read -- gasifiable --.

Column 15,
Line 26, "303, it" should read -- 303 --;
Line 35, "present, invention" should read -- present invention, --; and
Line 57, "mtorr," should read -- mTorr, --.

Column 16,
Line 23, ""a-SiC:(X,H)" should read -- a-SiC;(X,H)"), --; and
Line 24, "")," should be deleted.

Column 19,
Line 10, "mtorr." should read -- mTorr. --.

Column 24,
Line 6, "space" should read -- space. --.

Column 25,
Line 7, "FIG. 3" should read -- FIG. 3. --;
Line 21, "items" should read -- items. --; and
Line 59, "FIG. 3" should read -- FIG. 3. --.

UNITED STATES PATENT AND TRADEMARK OFFICE
CERTIFICATE OF CORRECTION

PATENT NO.    : 6,336,423 B1
DATED         : January 8, 2002
INVENTOR(S)   : Ryuji Okamura et al.

It is certified that error appears in the above-identified patent and that said Letters Patent is hereby corrected as shown below:

<u>Column 27,</u>
Line 45, "Example 1" should read -- Example 1. --;

<u>Column 30,</u>
Line 53, "claim 5" should read -- claim 5, --;
Line 56, "a" should read -- an --;
Line 59, "claim 8" should read -- claim 8, --; and
Line 63, "claim 8" should read -- claim 8, --.

<u>Column 31,</u>
Line 9, "claim 1" should read -- claim 1, --.

Signed and Sealed this

First Day of October, 2002

Attest:

JAMES E. ROGAN
Attesting Officer       *Director of the United States Patent and Trademark Office*